US011495744B2

(12) United States Patent
Onodera et al.

(10) Patent No.: US 11,495,744 B2
(45) Date of Patent: Nov. 8, 2022

(54) ORGANIC SEMICONDUCTOR COMPOSITION, ORGANIC THIN FILM, AND ORGANIC THIN FILM TRANSISTOR

(71) Applicant: Nippon Kayaku Kabushiki Kaisha, Tokyo (JP)

(72) Inventors: Nozomi Onodera, Tokyo (JP); Satoru Inoue, Tokyo (JP); Yuichi Sadamitsu, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 62 days.

(21) Appl. No.: 16/495,914

(22) PCT Filed: Mar. 19, 2018

(86) PCT No.: PCT/JP2018/010840
§ 371 (c)(1),
(2) Date: Sep. 20, 2019

(87) PCT Pub. No.: WO2018/174014
PCT Pub. Date: Sep. 27, 2018

(65) Prior Publication Data
US 2020/0136061 A1    Apr. 30, 2020

(30) Foreign Application Priority Data

Mar. 21, 2017 (JP) ............................. JP2017-054440
Aug. 31, 2017 (JP) ............................. JP2017-167640

(51) Int. Cl.
*H01L 51/00* (2006.01)
*H01L 51/05* (2006.01)

(52) U.S. Cl.
CPC ........ *H01L 51/0007* (2013.01); *H01L 51/004* (2013.01); *H01L 51/0035* (2013.01);
(Continued)

(58) Field of Classification Search
None
See application file for complete search history.

(56) References Cited

U.S. PATENT DOCUMENTS

2004/0225056 A1* 11/2004 Spreitzer ............... C09K 11/06
524/570
2005/0067949 A1*  3/2005 Natarajan ........... H01L 51/0004
313/504
(Continued)

FOREIGN PATENT DOCUMENTS

JP     2005228804 A  *  8/2005
JP     2006514710 A      5/2006
(Continued)

OTHER PUBLICATIONS

English text machine translation of Inoue (JP 2005-228804 A), accessed online from Espacenet, PDF copy attached. (Year: 2005).*
(Continued)

*Primary Examiner* — Katie L. Hammer
(74) *Attorney, Agent, or Firm* — The Webb Law Firm

(57) ABSTRACT

The purpose of the present invention is to provide: an organic semiconductor composition suitable for preparing an organic thin film by a solution method, an organic thin film obtained by using the organic semiconductor composition, and a practical field effect transistor which uses the organic thin film. The practical field effect transistor which uses the organic thin film has small variances in mobility and a threshold value, while maintaining a high mobility. Disclosed in the present specification is an organic semiconductor composition including an organic semiconductor compound, an insulation compound, an organic solvent A, which is a good solvent for the insulation compound, and an organic solvent B, which is a poor solvent for the insulation compound and has a higher boiling point than the organic
(Continued)

solvent A. The mass ratio a:b of the organic solvent A and the organic solvent B is 1:8 to 8:1.

15 Claims, 2 Drawing Sheets

(52) U.S. Cl.
CPC ...... *H01L 51/0074* (2013.01); *H01L 51/0094* (2013.01); *H01L 51/0508* (2013.01); *H01L 51/0566* (2013.01); *H01L 51/0004* (2013.01); *H01L 51/052* (2013.01); *H01L 51/0541* (2013.01)

(56) References Cited

U.S. PATENT DOCUMENTS

| | | |
|---|---|---|
| 2006/0155040 A1 | 7/2006 | Veres et al. |
| 2007/0173578 A1 | 7/2007 | Spreitzer et al. |
| 2008/0142792 A1* | 6/2008 | Park .................. C07D 495/22 257/40 |
| 2008/0191199 A1* | 8/2008 | Anemian ............ H01L 51/052 556/432 |
| 2008/0265214 A1 | 10/2008 | Steiger et al. |
| 2009/0041928 A1* | 2/2009 | Bright ................ H01L 51/0005 427/58 |
| 2011/0092015 A1* | 4/2011 | Clough ............... H01L 51/0094 257/E51.027 |
| 2011/0108813 A1 | 5/2011 | Kohiro et al. |
| 2011/0180787 A1* | 7/2011 | Cho ..................... C09D 11/52 427/256 |
| 2013/0248771 A1* | 9/2013 | Mitchell ............. H01L 51/0094 252/301.16 |
| 2017/0125694 A1 | 5/2017 | Shigenoi et al. |
| 2017/0162805 A1* | 6/2017 | Mitchell ............... C07F 7/0812 |
| 2017/0288152 A1 | 10/2017 | Kariya et al. |
| 2017/0309836 A1 | 10/2017 | Niori |
| 2019/0375956 A1* | 12/2019 | Pan ..................... H01L 51/0058 |

FOREIGN PATENT DOCUMENTS

| | | | |
|---|---|---|---|
| JP | 2007527624 A | | 9/2007 |
| JP | 2008503870 A | | 2/2008 |
| JP | 2008198992 A | | 8/2008 |
| JP | 2009238968 A | | 10/2009 |
| JP | 2011258824 A | | 12/2011 |
| JP | 2014146637 A | | 8/2014 |
| JP | WO2016052056 A1 | | 4/2016 |
| WO | 2009122956 A1 | | 8/2009 |
| WO | 2014115515 A1 | | 7/2014 |
| WO | 2015147266 A1 | | 1/2015 |
| WO | 2016129479 A1 | | 8/2016 |
| WO | 2016143774 A1 | | 9/2016 |

OTHER PUBLICATIONS

Bharti et al.; Phase separation induced high mobility and electrical stability in organic field-effect transistors, Synthetic Metals, 2016, vol. 221, pp. 186-191.

Zhang et al., Importance of Domain Purity in Semi-Conducting Polymer/Insulating Polymer Blends Transistors, Journal of Polymer Science, Part B: Polymer Physics, May 9, 2016, vol. 54, pp. 1760-1766.

Cheng et al., Spontaneous Formation of an Ideal-Like Field-Effect Channel for Decay-Free Polymeric Thin-Film Transistors by Multiple-Scale Phase Separation, American Chemical Society, Applied Materials & Interfaces, Jul. 15, 2015, vol. 7, pp. 16486-16494.

Yokota et al., Control of threshold voltage in low-voltage organic complementary inverter circuits with floating gate structures, Applied Physics Letters, May 11, 2011, vol. 98, No. 193302.

Extended European Search Report issued in EP 18772670.8 dated Nov. 20, 2020.

Niazi et al., Solution-printed organic semiconductor blends exhibiting transport properties on par with single crystals, Nature Communications, Nov. 23, 2015, vol. 6, No. 1, pp. 1-10.

Lada et al., Morphology control via dual solvent crystallization for high-mobility functionalized pentacene-blend thin film transistors, Journal of Materials Chemistry, 2011, vol. 21, pp. 11232-11238.

Niazi et al., Supplementary Figures 1-17, Solution-printed organic semiconductor blends exhibiting transport properties on par with single crystals, Nature Communications, Nov. 23, 2015, vol. 6, No. 1, pp. 1-10.

* cited by examiner

[Figure 1]
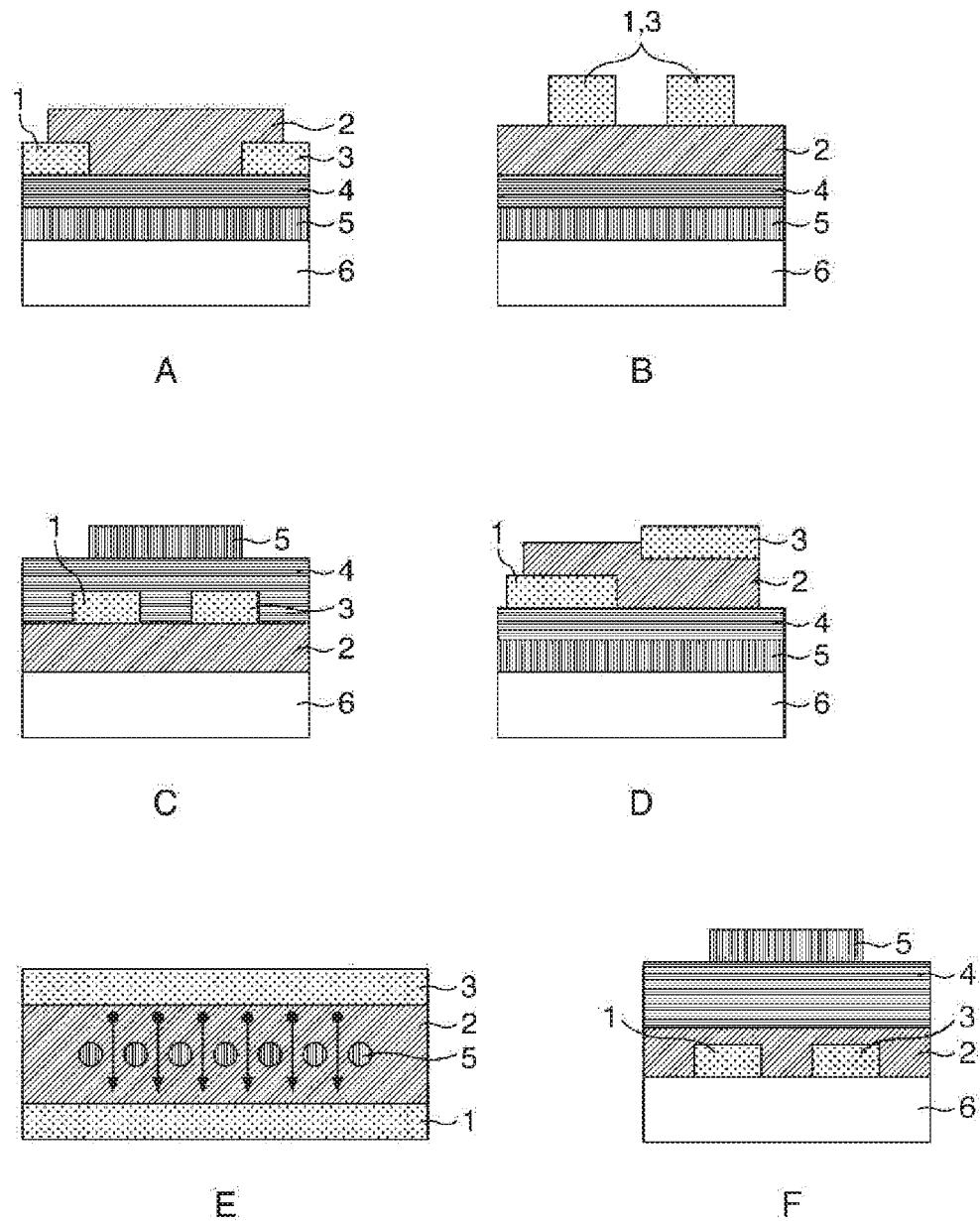

[Figure 2]
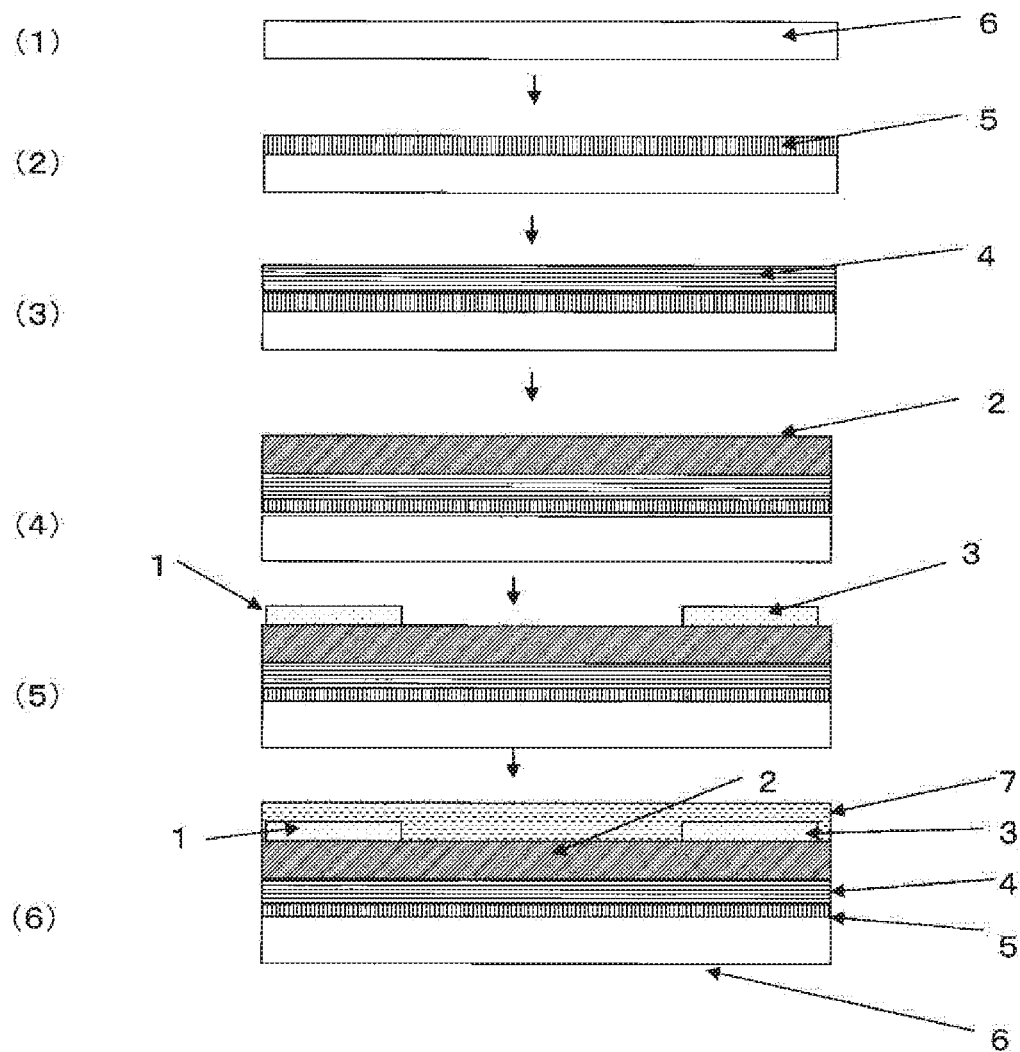

ORGANIC SEMICONDUCTOR COMPOSITION, ORGANIC THIN FILM, AND ORGANIC THIN FILM TRANSISTOR

CROSS-REFERENCE TO RELATED APPLICATIONS

This application is the United States national phase of International Application No. PCT/JP2018/010840 filed Mar. 19, 2018, and claims priority to Japanese Patent Application Nos. 2017-054440 filed Mar. 21, 2017, and 2017-167640 filed Aug. 31, 2017, the disclosures of which are hereby incorporated by reference in their entirety.

TECHNICAL FIELD

This invention relates to an organic semiconductor composition, an organic thin film obtained by applying or printing the organic semiconductor composition, and an organic thin film transistor containing the organic thin film.

BACKGROUND ART

A field effect transistor generally has a structure having a source electrode, a drain electrode, and a gate electrode provided with these electrodes via an insulation layer are provided on a semiconductor on a substrate. At present, inorganic semiconductor materials represented by silicon are mainly used for field effect transistors. In particular, thin film transistors provided with a layer made of amorphous silicon on a substrate such as glass are used as a logic circuit element for an integrated circuit in display field etc., and widely used for a switching device. Recently, researches on using oxide semiconductors as semiconductor materials have been actively considered. However, when such inorganic semiconductor materials are used, processing with high temperature is required during the manufacturing of the field effect transistor. Therefore, a film and a plastic, etc. having poor heat resistance cannot be used for the substrate. In addition to that the manufacturing equipment is expensive, a large amount of energy is required during manufacturing. Therefore, the obtained field effect transistor is expensive, and application thereof is very limited.

On the other hand, a field effect transistor using an organic semiconductor material which does not require high temperature processing during the manufacturing has been developed. When the organic semiconductor material can be used, the manufacturing can be conducted in low temperature process to expand the range of substrate materials to be used. As a result, comparing with using inorganic semiconductors such as amorphous silicon, a thin film transistor (organic thin film transistor) which is more flexible, lighter, and less fragile can be manufactured. As a manufacturing method thereof, a solution containing an organic semiconductor material can be applied or an inkjet printing can be conducted, and therefore, a large-area field effect transistor can be manufactured at low cost.

However, because many organic compounds conventionally used as an organic semiconductor material are hardly soluble in organic solvents, inexpensive methods such as applying method and printing method cannot be used. Therefore, forming an organic thin film on the substrates by using expensive methods such as vacuum deposition was generally adopted.

Recently, by improving the solubility of an organic compound in an organic solvent, an organic thin film transistor which exhibits relatively high carrier mobility can have been obtained by an application method. However, in order to put a device made of an organic semiconductor material into practical use, small variance in mobility and threshold value are required for mass-production, and research on manufacturing of organic thin film transistors by the application methods is now actively considered.

Non-Patent Literature 1 discloses a manufacturing method of an organic thin film by a drop casting method using an organic semiconductor solution obtained by mixing TIPS-pentacene with polystyrene, and describes an organic semiconductor device having the organic thin film exhibiting excellent mobility and improved mobility variance. However, the method mentioned in Non-Patent Literature 1 is insufficient to improve the variance of threshold value.

Non-Patent Literature 2 discloses a manufacturing method for forming an organic thin film by an inkjet method using an organic semiconductor solution in which poly[2,5-bis(alkyl)pyrrolo[3,4-c]pyrrole-1,4(2H,5H)-dione-alt-5,5-di(thiophen-2-yl)22,20-(E)-2-(2-(thiophen-2-yl)vinyl)-thiophene] and polystyrene are dissolved in a mixed solution in which 20% of 2-chlorophenol is added to chlorobenzene, and describes an organic semiconductor device having the organic thin film exhibiting excellent mobility and improved mobility variance. However, the method mentioned in Non-Patent Literature 2 is also insufficient to improve the variance in threshold value.

Non-Patent Literature 3 discloses a manufacturing method for forming an organic thin film using an organic semiconductor solution obtained by mixing poly(3-hexyl-thiophene-2,5-diyl) with PMMA, and an organic semiconductor device having the organic thin film which improves leak current and an on/off ratio. However, the method mentioned in Non-Patent Literature 3 is insufficient in mobility, which cannot be practically used.

Non-Patent Literature 4 describes that threshold value control is necessary to use a TFT in a logic circuit, and proposes a floating gate method as a specific method thereof. However, Non-Patent Literature 4 relates to the improvement of the configuration (design) of the element, and does not describe that threshold value is controlled by improvement of organic semiconductor materials or organic semiconductor solutions themselves, and does not mention any mobility.

Patent Literature 1 discloses a manufacturing method of making an organic thin film by an inkjet method using an organic semiconductor solution containing an organic semiconductor compound, a polymer component, solvents A and B which are good solvents for the organic semiconductor, and a solvent C which is a poor solvent for the organic semiconductor, and describes that an electroluminescence device having the organic thin film exhibits high brightness. However, any properties of the organic thin film transistor having the organic thin film are not mentioned in Patent Literature 1.

Patent Literature 2 discloses a manufacturing method for improving mobility by mixing an organic semiconductor compound with a polymer component in a specific ratio. However, mobility in Example of Patent Literature 2 is $8.8 \times 10^{-3}$ cm$^2$/Vs at the highest value, which cannot be said to be a practical value.

Patent Literature 3 discloses a manufacturing method of an organic thin film using a polymer organic semiconductor material and an organic semiconductor solution containing a solvent A which are a good solvent for the organic semiconductor and a solvent B which is a poor solvent for the organic semiconductor, and describes that an electroluminescence device having the organic thin film exhibits high brightness. However, any properties of an organic thin film transistor having the organic thin film is not mentioned in Patent Literature 3.

Patent Literature 4 discloses a manufacturing method of an organic thin film using an organic semiconductor composition containing an organic semiconductor compound, a liquid crystalline compound and an insulation polymer compound, and describes that an organic semiconductor device having the organic thin film exhibits high mobility of 1 to 2 $cm^2/Vs$. However, variance of mobility and threshold value are not mentioned in Patent Literature 4.

Patent Literature 5 discloses a manufacturing method of an organic thin film using an organic semiconductor composition containing an organic semiconductor compound, a silicon compound and an insulation polymer compound, and that an organic semiconductor device having the organic thin film exhibits a mobility of 0.1 $cm^2/Vs$ or more and that the smallest value of mobility variance is less than 20%. However, variance in mobility is not mentioned in Patent Literature 5.

Patent Literature 6 discloses a manufacturing method of an organic thin film using an organic semiconductor composition containing two kinds of organic semiconductor compounds and describes that the organic semiconductor device having an organic thin film exhibits mobility of 0.1 $cm^2/Vs$ or more and that the smallest variance of mobility variance is less than 20%. However, variance in mobility is not mentioned in Patent Literature 6.

Patent Literature 7 discloses a manufacturing method of an organic thin film using an organic semiconductor composition containing a low molecular compound and a polymer compound having a carrier transportability and a difference of the solubility of between the polymer compound and the low molecular compound of 0.6 or more and 1.5 or less, and describes that an organic semiconductor device having the organic thin film exhibits mobility of 2.1 $cm^2/Vs$. However, variance of mobility and threshold value are not mentioned in Patent Literature 7.

CITATION LIST

Patent Literature

Patent Literature 1: JP-T-2007-527624
Patent Literature 2: JP-T-2006-514710
Patent Literature 3: JP-T-2008-503870
Patent Literature 4: WO2016/143774
Patent Literature 5: WO2016/129479
Patent Literature 6: WO2015/147266
Patent Literature 7: WO2009/122956

Non-Patent Literature

Non-Patent Literature 1: Synthetic. Met. 2016, 221, 186.
Non-Patent Literature 2: Polymer Physics, 2016, 54, 1760.
Non-Patent Literature 3: Appl. Mater. Interfaces. 2015, 7, 16486.
Non-Patent Literature 4: Appl. Phys. Lett. 2011, 98, 193302

SUMMARY OF INVENTION

Technical Problem

The objects of the present invention are to provide an organic semiconductor composition capable of producing an organic thin film by solution methods, an organic thin film obtained by using the organic semiconductor composition and an practical organic thin film transistor having the organic thin film, which has small variance in mobility and threshold value while maintaining high mobility.

Solution to Problem

The present inventors have diligently continued to conduct the study toward solving the problems, and as a result, the present inventors have found that an organic semiconductor composition contains an organic semiconductor compound, an insulation compound, a good solvent for the insulation compound, a poor solvent for the insulation compound, wherein a boiling point of the poor solvent is higher than the boiling point of the good solvent. As a result, the present invention has been achieved.

In other words, the present invention relates to the followings:

[1] An organic semiconductor composition comprising
an organic semiconductor compound, an insulation compound, an organic solvent A which is a good solvent for the insulation compound and an organic solvent B which is a poor solvent for the insulation compound and has a higher boiling point than the organic solvent A, wherein the content mass ratio a:b of the organic solvent A and the organic solvent B is 1:8 to 8:1.

[2] The organic semiconductor composition according to [1],
wherein the organic semiconductor compound is a compound having an acene structure, a phenacene structure or a heteroacene structure.

[3] The organic semiconductor composition according to [2],
wherein the compound having the heteroacene structure is a compound having a thienothiophene structure.

[4] The organic semiconductor composition according to [1],
wherein the insulation compound is a compound having a following repeating unit of formula (1) or (2):

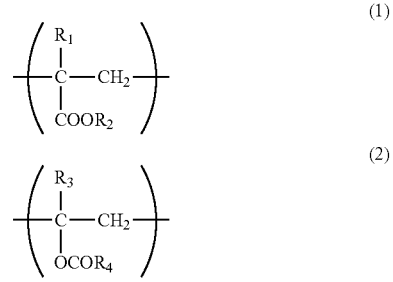

wherein, in the formula (1) and (2), $R_1$ to $R_4$ are each independently a linear or branched alkyl group having 1 to 20 carbon atoms.

[5] The organic semiconductor composition according to [4],
wherein the organic solvent A is a solvent comprising a compound having an ether group, a ketone group or an ester group, and the organic solvent B is a solvent comprising a hydrocarbon compound.

[6] The organic semiconductor composition according to [5],
wherein both the organic solvent A and the organic solvent B are solvents comprising an aromatic compound.

[7] The organic semiconductor composition according to [1],
wherein the insulation compound is a compound having a following repeating unit of formula (3):

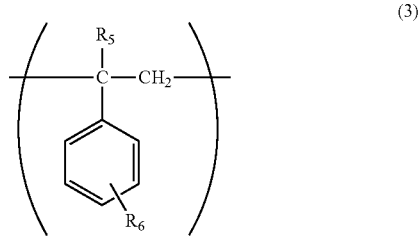

wherein in the formula (3), $R_5$ and $R_6$ are each a hydrogen atom or linear or a branched alkyl group having 1 to 8 carbon atoms.

[8] The organic semiconductor composition according to [7],
wherein the organic solvent A is a solvent comprising a hydrocarbon compound, and the organic solvent B is a solvent comprising an ether group, a ketone group or an ester group.

[9] The organic semiconductor composition according to [8],
wherein both the organic solvent A and the organic solvent B are solvents comprising a compound having an aromatic compound.

[10] The organic semiconductor composition according to [1],
wherein difference of a boiling point of between the organic solvent A and the organic solvent B is 10° C. or more.

[11] The organic semiconductor composition according to [10],
wherein the difference of the boiling point of between the organic solvent A and the organic solvent B is 130° C. or less.

[12] The organic semiconductor composition according to [1],
wherein both solubility of the organic semiconductor compound in the organic solvent A and solubility of the organic semiconductor compound in the organic solvent B are 0.2% by mass or more.

[13] The organic semiconductor composition according to [1],
wherein the solubility of the insulation compound in the organic solvent A is 0.5% by mass or more and the solubility of the insulation compound in the organic solvent B is 0.05% by mass or less.

[14] The organic semiconductor composition according to [1],
wherein difference of a hydrogen bonding term in a Hansen solubility parameter between the organic solvent A and the insulation compound is 2.5 cal/cm³ or less, and difference of a hydrogen bonding term in a Hansen solubility parameter between the organic solvent B and the insulation compound is 2.0 cal/cm³ or more.

[15] The organic semiconductor composition according to [14],
wherein the difference of the hydrogen bonding term in the Hansen solubility parameter of between the organic solvent B and the insulation compound is 5.0 cal/cm³ or less.

[16] The organic semiconductor composition according to [1],
wherein the content mass ratio a:b of the organic solvent A and the organic solvent B is 1:5 to 5:1.

[17] The organic semiconductor composition according to [16],
wherein the content mass ratio a:b of the organic solvent A and the organic solvent B is 1:5 to 2:1.

[18] The organic semiconductor composition according to [1],
wherein the content of the insulation compound based on the total amount of the organic semiconductor compound and the insulation compound is 1 to 80% by mass.

[19] The organic semiconductor composition according to [18],
wherein the content of the insulation compound based on the total amount of the organic semiconductor compound and the insulation compound is 1 to 15% by mass.

[20] An organic thin film obtained by using the organic semiconductor composition according to any one of [1] to [19].

[21] An organic thin film transistor having the organic semiconductor film according to [20].

Advantageous Effects of Invention

A practical organic thin film transistor having small variance in mobility while maintaining high mobility and having small variance in threshold value can be provided by using the organic semiconductor composition of the present invention.

BRIEF DESCRIPTION OF DRAWINGS

FIG. 1 shows a cross-sectional schematic drawings which shows several aspects of an organic thin film transistor (element) structure of the present invention. In the drawings, A is a bottom contact-bottom gate type organic thin film transistor (element), B is a top contact-bottom gate type organic thin film transistor (element), C is a top contact-top gate type organic thin film transistor (element), D is a top and bottom gate type organic thin film transistor (element), E is an electrostatic induction transistor (element), and F is a bottom contact-top gate type organic thin film transistor element).

FIG. 2 shows an explanatory drawing for the manufacturing process of the top contact-bottom gate type organic thin film transistor (element) as one aspect of the organic thin film transistor (element) of the present invention. In the drawings, (1) to (6) are cross-sectional schematic diagrams to show each step.

DESCRIPTION OF EMBODIMENT

Hereinafter, the present invention will be described in detail.

The organic semiconductor composition of the present invention contains an organic semiconductor compound, an insulation compound, an organic solvent A which is a good solvent for the insulation compound and an organic solvent B which is a poor solvent for the insulation compound having a higher boiling point than the organic solvent A.

The organic semiconductor compound contained in the organic semiconductor composition of the present invention means a compound of which the film exhibits semiconductor characteristics, when the film is obtained by using the compound alone or mixing the compound with another component and then conducting an evaporation method or a solvent method (a film forming method in which the solution of the compound is applied to a substrate and then the solvent is removed by heating).

The organic semiconductor compound is not limited to any of low molecular organic semiconductor compounds and polymer organic semiconductor compounds. The organic semiconductor compound is preferably a low molecular organic semiconductor compound, and the molecular weight of the low molecular organic semiconductor compound is usually 1500 or less, and 1000 or less is preferably, furthermore 700 or less is more preferably.

The structure of the organic semiconductor compound is also not particularly limited, as long as the compound is known as an organic semiconductor compound.

Specific examples of the organic semiconductor compound include acenes such as naphthacene, pentacene(2,3, 6-dibenzo anthracene), hexacene, heptacene, dibenzo pentacene, tetrabenzopentacene, anthradithiophene, pyrene, benzopyrene, dibenzopyrene, chrysene, perylene, coronene, terylene, ovalene, quaterrylene, circumanthracene; derivatives in which a part of carbon atoms of the compound is replaced with an atom such as nitrogen, sulfur or oxygen; derivatives in which at least one hydrogen atom bonded to carbon atoms of the compound is replaced with a functional group such as a carbonyl group (dioxaanthanthrene compound containing perixanthenoxanthene and derivatives thereof, triphenodioxazine, triphenodithiazine, hexacene-6, 15-quinone, etc.); and condensed polycyclic aromatic compounds such as a derivative in which a hydrogen atom of the compound is replaced with another functional group.

Other specific examples of the organic semiconductor compounds include not only compounds such as a metal phthalocyanine represented by copper phthalocyanine, tetrathiapentalene and derivatives thereof, condensed cyclic tetracarboxylic acid diimides such as naphthalene-1,4,5,8-tetracarboxylic acid diimide, N,N'-bis(4-trifluoromethylbenzyl)naphthalene-1,4,5,8-tetracarboxylic acid diimide, N,N'-(1H,1H-perfluorooctyl), N,N'-bis (1H,1H-perfluorobutyl), N,N'-dioctyl naphthalene-1,4,5,8-tetracarboxylic acid diimide derivatives, naphthalene tetracarboxylic acid diimides such as naphthalene-2,3,6,7-tetracarboxylic acid diimide, tetracarboxylic acid diimides such as anthracene tetracarboxylic acid diimides such as anthracene-2,3,6,7-tetracarboxylic acid diimide, but also fullerenes such as $C_{60}$, $C_{80}$, $C_{76}$, $C_{84}$ and derivatives thereof, carbon nanotubes such as single wall carbon nanotube (SWNT), dyes such as merocyanine dye and hexcyanine dye and derivatives thereof.

Furthermore, examples of the organic semiconductor compounds include polyanthracene, triphenylene and quinacridone.

Further other specific examples of the organic semiconductor compound include 4,4-biphenyldithiol (BPDT), 4,4-diisocyanobiphenyl, 4,4-diisocyano-p-terphenyl, 2,5-bis(5'-thioacetyl-2'-thiophenyl) thiophene, 2,5-bis(thioacetoxyl-2'-thiophenyl) thiophene, 4,4'-diisocyanophenyl, benzidine (biphenyl-4,4'-diamine), TCNQ (tetracyanoquinodimethane), tetrathiafulvalene(TIF) and derivatives thereof, electric field transfer complex represented by tetrathiafulvalene(TTF)-TCNQ complex, bisethylenetetrathiafulvalene(BEDTTTF)-perchlorate complex, BEDTTTF-iodine complex, TCNQ-iodine complex, biphenyl-4,4'-dicarboxylic acid, 1,4-di(4-thiophenylacetinyl)-2-ethylbenzene, 1,4-di(4-isocyanophenylacetylinyl)-2-ethylbenzene, 2,2''-dihydroxy-1,1': 4',1''-terphenyl, 4,4'-biphenyldiethanal, 4,4'-biphenyldiol, 4,4'-biphenyl diisocyanate, 1,4-diacetinylbenzene, diethyl biphenyl-4,4'-dicarboxylate, benzo[1,2-c;3,4-c';5,6-c"]tris[1,2]dithiol-1,4,7-trithione, α-sexithiophene, tetra thio tetracene, tetra seleno tetracene, tetra tellurium tetracene, poly(3-alkyl thiophene), poly(3-thiophene-β-ethanesulfonic acid), poly(N-alkyl pyrrole), poly(3-alkyl pyrrole), poly(3,4-dialkyl pyrrole), poly (2,2'-thienyl pyrrole) and poly(dibenzo thiophene sulfide).

The organic semiconductor compound used in the organic semiconductor composition of the present invention is preferably a condensed polycyclic aromatic compound, more preferably a condensed polycyclic aromatic compound having a phenacene structure, an acene structure or a heteroacene structure, further preferably a condensed polycyclic aromatic compound having a heteroacene structure, particularly preferably a condensed polycyclic aromatic compound having a thienothiophene structure, and most preferably a compound having the following formula (4) or (5).

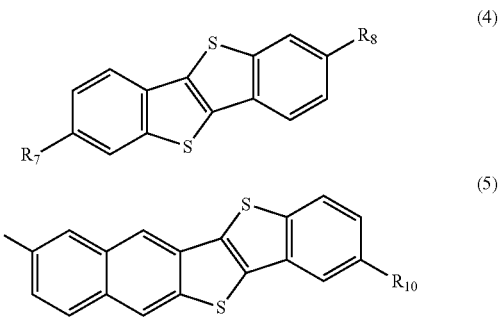

In formula (4), $R_7$ and $R_8$ are each independently an aliphatic hydrocarbon group having 1 to 36 carbon atoms.

In formula (5), either one of $R_9$ and $R_{10}$ is an alkyl group, an aromatic hydrocarbon group having an alkyl group or a heterocyclic group having an alkyl group, and the other is an aliphatic hydrocarbon group, an aromatic hydrocarbon group or a heterocyclic group, provided that the compound where both $R_9$ and $R_{10}$ are an alkyl groups is excluded.

The aliphatic hydrocarbon group having 1 to 36 carbon atoms represented by $R_7$ and $R_8$ in the formula (4) is not limited to any of saturated and unsaturated aliphatic hydrocarbon group, as long as the aliphatic hydrocarbon group only has 1 to 36 carbon atoms and hydrogen atoms. Also, the aliphatic hydrocarbon group is not limited to any of linear, branched or cyclic aliphatic hydrocarbon group. The aliphatic hydrocarbon group is preferably a linear or branched aliphatic hydrocarbon group, more preferably a linear aliphatic hydrocarbon group. The carbon number of the aliphatic hydrocarbon group is preferably 2 to 24, more preferably 4 to 20, and further more preferably 6 to 12.

Specific examples of the linear or branched saturated aliphatic hydrocarbon group include methyl group, ethyl group, propyl group, iso-propyl group, n-butyl group, iso-butyl group, t-butyl group, n-pentyl group, iso-pentyl group, t-pentyl group, sec-pentyl group, n-hexyl group, iso-hexyl group, n-heptyl group, sec-heptyl group, n-octyl group, n-nonyl group, sec-nonyl group, n-decyl group, n-undecyl group, n-dodecyl group, n-tridecyl group, n-tetradecyl group, n-pentadecyl group, n-hexadecyl group, n-heptadecyl group, n-octadecyl group, n-nonadecyl group, n-eicosyl group, docosyl group, n-pentacosyl group, n-octacosyl group, 5-(n-pentyl)decyl group, heneicosyl group, tricosyl group, tetracosyl group, hexacosyl group, heptacosyl group, nonacosyl group, n-triacontyl group, dotriacontyl group and hexatriacontyl group.

Specific examples of the cyclic saturated aliphatic hydrocarbon group include cyclohexyl group, cyclopentyl group, adamantyl group and norbornyl group.

Specific examples of the linear or branched unsaturated aliphatic hydrocarbon group include vinyl group, allyl group, eicosadienyl group, 11,14-eicosadienyl group, geranyl(trans-3,7-dimethyl-2,6-octadiene-1-yl) group, farnesyl (trans,trans-3,7,11-trimethyl-2,6,10-dodecatrien-1-yl) group, 4-pentenyl group, 1-propynyl group, 1-hexynyl group, 1-octynyl group, 1-decynyl group, 1-undecynyl group, 1-dodecynyl group, 1-tetradecynyl group, 1-hexadecynyl group and 1-nonadecynyl group.

The hydrogen atom in the aliphatic hydrocarbon group having 1 to 36 carbon atoms represented by $R_7$ and $R_8$ in the formula (4) may be replaced with the halogen atom. Examples of the halogen atom which may be replaced with a hydrogen atom include a fluorine atom, a chlorine atom, a bromine atom and an iodine atom, preferably a fluorine atom, a chlorine atom or a bromine atom, and more preferably a fluorine atom or a bromine atom. Specific examples of the halogeno substituted aliphatic hydrocarbon group in which a hydrogen atom is replaced with a halogen atom include chloromethyl group, bromomethyl group, trifluoromethyl group, pentafluoroethyl group, n-perfluoropropyl group, n-perfluorobutyl group, n-perfluoropentyl group, n-perfluorooctyl group, n-perfluorodecyl group, n-(dodecafluoro)-6-iodohexyl, 2,2,3,3,3-pentafluoropropyl group and 2,2,3,3-tetrafluoropropyl group.

As a compound represented by formula (4), combination of preferable $R_7$ and preferable $R_8$ is more preferable, and combination of more preferable $R_7$ and more preferable $R_8$ is further preferable.

Specific examples include compounds in which $R_7$ and $R_8$ each independently are preferably a linear or branched aliphatic hydrocarbon group having 2 to 24 carbon atoms, or a linear or branched halogeno-substituted aliphatic hydrocarbon group having 2 to 24 carbon atoms, more preferably a linear or branched aliphatic hydrocarbon group having 4 to 20 carbon atoms, or a linear or branched halogeno-substituted aliphatic hydrocarbon group having 4 to 20 carbon atoms, further preferably a linear or branched aliphatic hydrocarbon group having 6 to 12 carbon atoms, or a linear or branched halogeno-substituted aliphatic hydrocarbon group having 6 to 12 carbon atoms, still further preferably a linear aliphatic hydrocarbon group having 6 to 12 carbon atoms, or a linear halogeno-substituted aliphatic hydrocarbon group having 6 to 12 carbon atoms. $R_7$ and $R_8$ may be the same or different from each other.

The alkyl group represented by $R_9$ or $R_{10}$ in the formula (5) is not limited to any of linear, a branched or cyclic alkyl group. Specific examples thereof include methyl group, ethyl group, propyl group, isopropyl group, n-butyl group, iso-butyl group, allyl group, t-butyl group, n-pentyl group, n-hexyl group, n-octyl group, n-decyl group, n-dodecyl group, n-tridecyl group, n-tetradecyl group, n-cetyl group, n-heptadecyl group, n-butenyl group, 2-ethylhexyl group, 3-ethylheptyl group, 4-ethyloctyl group, 2-butyloctyl group, 3-butylnonyl group, 4-butyldecyl group, 2-hexyldecyl group, 3-octylundecyl group, 4-octyldodecyl group, 2-octyldodecyl group, 2-decyltetradecyl group, cyclohexyl group, cyclopentyl group, adamanchiru group, norbornyl group. Preferably, a linear or branched alkyl group such as n-butyl group, n-hexyl group, n-octyl group, n-decyl group, n-dodecyl group, ethylhexyl group, ethyloctyl group, butyloctyl group, hexyldecyl group, and more preferably n-hexyl group, n-octyl group, n-decyl group, 2-ethylhexyl group, 3-ethylhexyl group, 3-ethyloctyl group or 3-butyloctyl group.

The alkyl group represented by $R_9$ or $R_{10}$ in the formula (5) is preferably a linear or branched alkyl group having 2 to 16 carbon atoms, more preferably a linear or branched alkyl group having 4 to 12 carbon atoms, further preferably a linear alkyl group having 4 to 10 carbon atoms or a branched alkyl group having 6 to 12 carbon atoms, particularly preferably a linear or branched alkyl group having 6 to 10 carbon atoms, and most preferably a linear alkyl group having 6 to 10 carbon atoms.

The aromatic hydrocarbon group in the aromatic hydrocarbon group having an alkyl group represented by $R_9$ or $R_{10}$ in the formula (5) means a residue obtained by removing one hydrogen atom from the aromatic hydrocarbon, and specific examples for the aromatic hydrocarbon group include phenyl group, naphthyl group, anthryl group, phenanthryl group, pyrenyl group and benzopyrenyl group.

The aromatic hydrocarbon group in the aromatic hydrocarbon group having an alkyl group represented by $R_9$ or $R_{10}$ in the formula (5) is preferably phenyl group or naphthyl group, and more preferably a phenyl group.

The alkyl group in the aromatic hydrocarbon group having an alkyl group represented by $R_9$ or $R_{10}$ in the formula (5) includes ones which are the same as an alkyl group represented by $R_9$ or $R_{10}$ in the formula (5). The alkyl group in the aromatic hydrocarbon group having an alkyl group is preferably a linear or branched alkyl group having 1 to 10 carbon atoms, more preferably a linear or branched alkyl group having 1 to 6 carbon atoms, and further preferably a linear alkyl group having 1 to 6 carbon atoms.

The substitution position of alkyl group on the aromatic hydrocarbon group in the aromatic hydrocarbon group having an alkyl group represented by $R_9$ or $R_{10}$ in the formula (5) is not particularly limited, but for example, the substitution position of alkyl group is preferably 4-position when the aromatic hydrocarbon group is phenyl group.

The heterocyclic group in the heterocyclic group having an alkyl group represented by $R_9$ or $R_{10}$ in the formula (5) means a residue obtained by removing one hydrogen atom from the heterocyclic ring. Specific examples of the heterocyclic group include pyridyl group pyrazyl group, pyrimidyl group, quinolyl group, isoquinolyl group, pyrrolyl group, indolenyl group, imidazolyl group, carbazolyl group are thienyl group, furyl group, pyranyl group, pyridonyl group, benzoquinolyl group, anthraquinolyl group, benzothienyl group, benzofuryl group and thienothienyl group.

The heterocyclic group in the heterocyclic group having an alkyl group represented by $R_9$ or $R_{10}$ in the formula (5) is preferably pyridyl group, thienyl group, benzothienyl group or thienothienyl group, more preferably thienyl group or benzothienyl group, and further preferably thienyl group.

Examples of the alkyl group in the heterocyclic group having an alkyl group represented by $R_9$ or $R_{10}$ in the formula (5) include ones which are the same as an alkyl group represented by $R_9$ or $R_{10}$ in the formula (5), and the alkyl group in the heterocyclic group having an alkyl group is preferably a liner or branched alkyl group having 1 to 10 carbon atoms, more preferably a linear or branched alkyl group having 4 to 8 carbon atoms, and further preferably a linear alkyl group having 4 to 8 carbon atoms.

Examples of the aliphatic hydrocarbon group represented by $R_9$ or $R_{10}$ in the formula (5) (aliphatic hydrocarbon group represented by the other) include ones which are the same as the aliphatic hydrocarbon groups represented by $R_7$ and $R_8$ in the formula (4). The carbon number of the aliphatic hydrocarbon group is preferably 1 to 30, more preferably 1 to 20, and further preferably 4 to 16. Specific examples include preferably a saturated linear or branched alkyl groups such as n-butyl group, n-hexyl group, n-octyl group, n-decyl group, n-dodecyl group, ethylhexyl group, ethyloctyl group, butyloctyl group and hexyldecyl group, more preferably n-hexyl group, n-octyl group, n-decyl group, 2-ethylhexyl group, 3-ethylhexyl group and 3-ethyloctyl group.

Examples of the aromatic hydrocarbon group represented by $R_9$ or $R_{10}$ in the formula (5) (aromatic hydrocarbon group represented by the other) includes ones which are the same as the aromatic hydrocarbon groups described in the above section of the aromatic hydrocarbon group having an alkyl group represented by $R_9$ or $R_{10}$ in the formula (5), and the aromatic hydrocarbon group is preferably a phenyl group, naphthyl group or pyridyl group, more preferably phenyl group or naphthyl group, and further preferably phenyl group.

The heterocyclic group represented by $R_9$ or $R_{10}$ in the formula (5) (the heterocyclic group represented by the other) includes ones which are the same as the heterocyclic group described in the above section of the heterocyclic group having an alkyl group represented by $R_9$ or $R_{10}$ in the formula (5), and is preferably pyridyl group, thienyl group or benzothienyl group, and more preferably and thienyl group or benzothienyl group.

The aromatic hydrocarbon group (aromatic hydrocarbon group represented by the other) and the heterocyclic group (heterocyclic group represented by the other) which represented by $R_9$ or $R_{10}$ in the formula (5) may have substituents. Examples of the substituent which may be contained include ones which are the same as an alkyl group represented by $R_9$ or $R_{10}$ in the formula (5), substituent is preferably a linear or branched alkyl group having 1 to 6 carbon atoms, and more preferably a linear alkyl group having 1 to 6 carbons.

As a compound represented by formula (5), a compound including the combination of preferable $R_9$ and preferable $R_{10}$ is more preferable, and a compound including the combination of more preferable $R_9$ and more preferable $R_{10}$ is further preferable.

Specifically, a compound in which one of $R_9$ and $R_{10}$ is phenyl group having a linear or branched alkyl group having 1 to 10 carbon atoms or a linear or branched alkyl group having 1 to 16 carbon atoms and the other is phenyl group, pyridyl group, thienyl group or benzothienyl group which may have a linear or branched alkyl group having 1 to 6 carbon atoms is preferable. A compound in which one of $R_9$ and $R_{10}$ is a linear or branched alkyl group having 4 to 16 carbon atoms and the other is phenyl group, thienyl group or benzothienyl group which may have a linear or branched alkyl group having 1 to 6 carbon atoms is more preferable. A compound in which one of $R_9$ and $R_{10}$ is a linear or branched alkyl group having 4 to 12 carbon atoms and the other is phenyl group or benzothienyl group which may have a linear or branched alkyl group having 1 to 6 carbon atoms is further preferable. A compound in which one of $R_9$ and $R_{10}$ is a linear alkyl group having 4 to 10 carbon atoms or a branched alkyl group having 6 to 12 carbon atoms and the other is phenyl group which may have a linear or branched alkyl group having 1 to 6 carbon atoms is particularly preferable. A compound in which one of $R_9$ and $R_{10}$ is a linear alkyl group having 6 to 10 carbon atoms and the other is a phenyl group is most preferable.

The content of the organic semiconductor compound in the organic semiconductor composition of the present invention is preferably in a range of 0.1 to 20% by mass, more preferably 0.2 to 15% by mass, and further preferably 0.3 to 10% by mass. In the specification, unless otherwise described, "%" means "% by mass", and "part" means "part by mass".

In the specification, the insulation compound contained in the organic semiconductor composition of the present invention means a compound excluding the compounds having conductivity and the compounds having semiconductor characteristics. The structure and the molecular weight thereof are not particularly limited, but a general insulation organic polymer can be preferably used.

The insulation organic polymer is preferably vinyl polycarboxylate, polyvinyl acetal, polystyrene, polycarbonate, polyarylate, polyester, polyamide, polyimide, polyurethane, polysiloxane, polysulfone, polymethyl methacrylate, cellulose, polyethylene, polypropylene, and copolymers, rubbers or thermoplastic elastomers thereof, and more preferably vinyl polycarboxylate, polyvinyl acetal, polystyrene, polymethyl methacrylate or polymethyl acrylate.

In other words, the insulation compound is preferably a compound having the following repeating unit of the formulas (1) and/or (2).

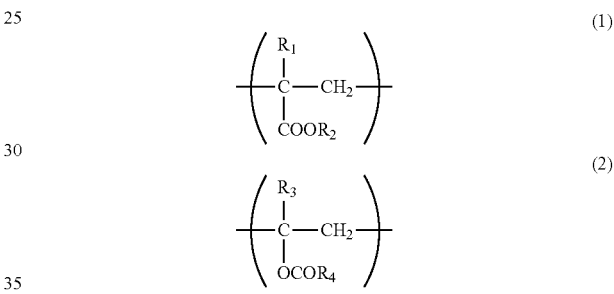

In the formulas (1) and (2), $R_1$ to $R_4$ are each independently a linear or branched alkyl group having 1 to 20 carbon atoms.

$R_1$ and $R_2$ in the formula (1) are each preferably a linear or branched alkyl group having 1 to 8 carbon atoms, more preferably a linear or branched alkyl group having 1 to 6 carbon atoms, further preferably a linear alkyl group having 2 to 4 carbon atoms, and particularly preferably a methyl group.

In the formula (2), $R_3$ and $R_4$ are each preferably a linear or branched alkyl group having 1 to 17 carbon atoms, more preferably a linear alkyl having 5 to 17 carbon atoms.

As an insulation compound, the compound having the following repeating unit of the formula (3) is also preferable.

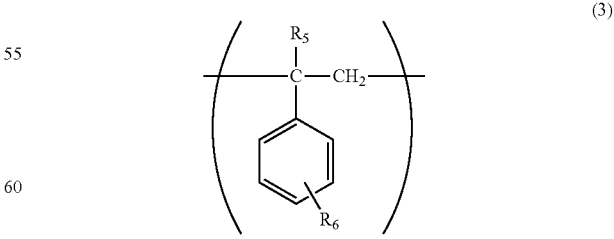

In the formula (3), $R_5$ and $R_6$ are each a hydrogen atom or a linear or branched alkyl group having 1 to 8 carbon atoms.

$R_5$ and $R_6$ in formula (3) are each preferably a linear or branched alkyl group having 1 to 8 carbon atoms or a hydrogen atom, more preferably a linear or branched alkyl group having 1 to 6 carbon atoms or a hydrogen atom, further preferably a linear alkyl group having 2 to 4 carbon atoms or a hydrogen atom, a hydrogen atom is particularly preferable.

The molecular weight of the insulation compound is not particularly limited, but is preferably the insulation organic polymer, and preferably the insulation organic polymer having at least one repeating unit of the above formulas (1) to (3). The molecular weight of the insulation organic polymer is preferably 1000 to 2000000, more preferably 5000 to 1500000, further preferably 10000 to 1200000, at a weight-average molecular weight.

In the specification, the weight average molecular weight means a value calculated in terms of polystyrene based on the measurement results of GPC.

The content of the insulation compound in the organic semiconductor composition of the present invention is preferably 1 to 80% by mass, more preferably 1 to 15% by mass, based on the total of the organic semiconductor compound and the insulation compound. The content ratio of the organic semiconductor compound and the insulation compound (organic semiconductor compound: insulation compound) is preferably 99:1 to 20:80, more preferably 99:1 to 60:40, and further preferably 99:1 to 90:10.

The organic solvent A contained in the organic semiconductor composition of the present invention is a good solvent of the insulation compound contained in the organic semiconductor composition of the present invention, and the organic solvent B is a poor solvent for the insulation compound, and the organic solvent A has a lower boiling point than a boiling point of the organic solvent B.

In the specification, "good solvent for the insulation compound" means a solvent capable of dissolving 0.1 part or more of the insulation compound in 100 parts of the solvent, and "poor solvent for the insulation compound" means a solvent capable of dissolving less than 0.1 part of the insulation compound in 100 parts of the solvent.

The organic solvent A is a good solvent for the insulation compound, and the solubility of the organic solvent A is preferably 0.1% or more, more preferably 0.3% or more, further preferably 0.5% or more.

The organic solvent B is a poor solvent for the insulation compound, and the solubility of the organic solvent B is preferably less than 0.1% and 0.01% or more, more preferably less than 0.05% and 0.01% or more.

Both the organic solvent A and the organic solvent B are preferably good solvents for the organic semiconductor compound, and the solubility is preferably 0.05% or more, more preferably 0.1% or more, and further preferably 0.2% or more.

The boiling points of the organic solvent A and the organic solvent B are not particularly limited, as long as the boiling point of the organic solvent A is lower than the boiling point of the organic solvent B, but when assuming the actual printing application process, the safety, the storage and the compositional stability during manufacturing of the solvent are necessary to be considered. Therefore, the boiling point of at least one of solvent is preferably 140° C. or more, and more preferably the boiling point of at least one of solvent is 170° C. or more.

The difference between the boiling point of the organic solvent A and the boiling point of the organic solvent B is preferably 5° C. or more, more preferably 10° C. or more, further preferably 10° C. or more and less than 130° C., particularly preferably 10° C. or more and less than 100° C., and most preferably 10° C. or more and less than 60° C.

When a compound having a repeating unit of the above formula (1) and/or (2) (for example, PMMA etc.) is used as an insulation compound, the organic solvent A is preferably a solvent consisting of a compound having an ether group, a ketone group or an ester group, more preferably aromatic solvents having an ether group, a ketone group or an ester group, further preferably anisole solvents such as anisole, methylanisole, dimethylanisole, trichloroanisole, dichloroanisole, bromoanisole, fluoroanisole, ester solvents such as ethyl benzoate, butyl benzoate, methyl benzoate, benzyl benzoate, phenyl acetate and benzyl acetate, or ketone solvents such as acetophenone. The organic solvent B in this case is preferably a solvent consisting of hydrocarbon compounds, more preferably a solvent consisting of aromatic hydrocarbon compounds, and further preferably tetralin, cyclohexylbenzene or trimethylbenzene. Both the organic solvent A and the organic solvent B are solvents consisting of an aromatic compound is also a preferable aspect.

When a compound having a repeating unit of the above formula (3) (for example, polystyrene etc.) is used as an insulation compound, the organic solvent A is preferably a solvent consisting of a hydrocarbon compound, more preferably a solvent consisting of an aromatic hydrocarbon compound, o-xylene, trimethylbenzene, diethylbenzene or tetralin is further preferable. In this case, the solvent B is preferably a solvent consisting of a compound having an ether group, a ketone group or an ester group, more preferably a solvent consisting of an aromatic hydrocarbon compound having an ether group, a ketone group or an ester group, further preferably anisole solvents such as anisole, methylanisole, dimethylanisole, trichloroanisole, dichloroanisole, bromoanisole, fluoroanisole, ester solvents such as ethyl benzoate, butyl benzoate, methyl benzoate, benzyl benzoate, phenyl acetate and benzyl acetate, or ketone solvents such as acetophenone. Both the organic solvent A and the organic solvent B which are a solvent consisting of an aromatic compound is also a preferable aspect.

In the organic semiconductor composition of the present invention, the difference of a hydrogen bonding term in a Hansen solubility parameter HSP value of between the organic solvent A and the insulation compound is preferably 3.0 cal/cm$^3$ or less and the difference of a hydrogen bonding term in a Hansen solubility parameter of between the organic solvent B and the insulation compound is 2.0 cal/cm$^3$ or more, more preferably the difference of a hydrogen bonding term in a Hansen solubility parameter of between the organic solvent A and the insulation compound is 2.5 cal/cm$^3$ or less and the difference of a hydrogen bonding term in a Hansen solubility parameter of between the organic solvent B and the insulation compound is 2.0 cal/cm$^3$ or more, further preferably the difference of a hydrogen bonding term in a Hansen solubility parameter of between the organic solvent A and the insulation compound is 2.0 cal/cm$^3$ or less and the difference of a hydrogen bonding term in a Hansen solubility parameter of between the organic solvent B and the insulation compound is 2.0 cal/cm$^3$ or more and 5.0 cal/cm$^3$ or less.

Herein "HSP value" means the value of solubility parameter calculated using "HSPiP 3rd Edition" (software version 3.1.16) based on the formula explained in the text, *Hansen Solubility Parameters: A User's Handbook, Second Edition*, C. M. Hansen (2007), Taylor and Francis Group, LLC (*HsPiP manual*). It is noted that δD is a dispersion term, δP is a polar term, and δH is a hydrogen bonding term.

Preferred specific examples of the organic solvent A and the organic solvent B contained in the organic semiconductor composition of the present invention, the HSP values and the boiling point are shown in Tables 1 to 5 below.

TABLE 1

Preferred Specific Examples of Organic Solvents A and B

| Solvents | Dispersion Term (δD) | Polar Term (δP) | Hydrogen Bonding Term (δH) | Boiling Point (° C.) | CAS No. |
| --- | --- | --- | --- | --- | --- |
| acetophenone | 18.8 | 9.0 | 4.0 | 202 | 98-86-2 |
| 1-acetoxy-1,3-butadiene | 16.1 | 4.4 | 8.3 | 210 | 1515-76-0 |
| 2-acetylthiophene | 19.1 | 12.2 | 9.3 | 214 | 88-15-3 |
| allyl acetoacetate | 15.9 | 6.9 | 8.6 | 195 | 1118-84-9 |
| anethole | 18.5 | 4.3 | 6.0 | 231 | 104-46-1 |
| anisaldehyde | 19.4 | 11.9 | 8.3 | 243 | 135-02-4 |
| anisole | 17.8 | 4.4 | 6.9 | 154 | 100-66-3 |
| 2,3-benzofuran | 18.7 | 5.1 | 5.7 | 173 | 271-89-6 |
| benzophenone | 19.5 | 7.2 | 5.1 | 305 | 119-61-9 |
| benzoyl chloride | 19.3 | 6.8 | 4.5 | 198 | 98-88-4 |
| benzyl acetate | 18.3 | 5.7 | 6.0 | 214 | 140-11-4 |
| benzyl benzoate | 20.0 | 5.1 | 5.2 | 304 | 120-51-4 |
| benzyl ethyl ether | 18.4 | 3.8 | 3.8 | 185 | 539-30-0 |
| benzyl methacrylate | 16.8 | 4.1 | 4.1 | 248 | 2495-37-6 |
| bicyclohexyl | 17.0 | 0.0 | 0.0 | 239 | 92-51-3 |
| biphenyl | 19.7 | 1.0 | 2.0 | 256 | 92-52-4 |

TABLE 1-continued

Preferred Specific Examples of Organic Solvents A and B

| Solvents | Dispersion Term (δD) | Polar Term (δP) | Hydrogen Bonding Term (δH) | Boiling Point (° C.) | CAS No. |
| --- | --- | --- | --- | --- | --- |
| 4-bromophenetole | 19.5 | 7.7 | 5.3 | 233 | 588-96-5 |
| 2-bromoanisole | 19.8 | 8.4 | 6.7 | 223 | 578-57-4 |
| 4-bromobenzoyl chloride | 20.2 | 6.5 | 5.5 | 247 | 586-75-4 |
| butyl acetoacetate | 16.6 | 5.8 | 7.3 | 215 | 591-60-6 |
| butyl acrylate | 15.6 | 6.2 | 4.9 | 148 | 141-32-2 |
| butyl benzoate | 18.3 | 5.6 | 5.5 | 250 | 136-60-7 |
| butyl acetate | 15.6 | 2.9 | 5.6 | 164 | 109-21-7 |
| butyl cyclohexane | 16.2 | 0.0 | 0.6 | 180 | 1678-93-9 |
| butyl cyclopentane | 16.4 | 0.0 | 1.0 | 157 | 2040-95-1 |
| butyl methacrylate | 15.4 | 5.9 | 5.2 | 164 | 97-88-1 |
| butyl propionate | 15.7 | 5.5 | 5.9 | 146 | 590-01-2 |
| 3-butyltoluene | 17.4 | 0.1 | 1.0 | 205 | 1595-04-6 |
| butylbenzene | 17.4 | 0.1 | 1.1 | 183 | 104-51-8 |
| 2-butyltoluene | 17.6 | 0.1 | 1.0 | 185 | 1595-11-5 |
| 4-butyltoluene | 17.4 | 0.1 | 1.0 | 198 | 1595-05-7 |
| γ-butyrolactone | 18.0 | 16.6 | 7.4 | 206 | 96-48-0 |
| (+)-camphor | 17.8 | 10.3 | 5.2 | 204 | 464-49-3 |
| ε-caprolactone | 18.0 | 15.0 | 7.4 | 235 | 502-44-3 |

TABLE 2

Preferred Specific Examples of Organic Solvents A and B

| Solvents | Dispersion Term (δD) | Polar Term (δP) | Hydrogen Bonding Term (δH) | Boiling Point (° C.) | CAS No. |
| --- | --- | --- | --- | --- | --- |
| phenacyl chloride | 20.0 | 9.6 | 5.7 | 244 | 532-27-4 |
| 4-chloroacetophenone | 19.6 | 7.6 | 4.0 | 232 | 99-91-2 |
| 2-chlorophenetole | 19.2 | 8.1 | 4.4 | 210 | 614-72-2 |
| 1-chloro-2-ethylbenzene | 18.9 | 4.9 | 2.2 | 179 | 89-96-3 |
| 4-chlorophenetole | 19.3 | 6.3 | 4.4 | 214 | 622-61-7 |
| 4-chlorobenzoyl chloride | 19.9 | 6.7 | 5.1 | 222 | 122-01-0 |
| 3-chlorobenzyl chloride | 19.9 | 9.3 | 2.6 | 222 | 620-20-2 |
| 2-chloroethyl acetate | 16.7 | 9.6 | 8.8 | 145 | 542-58-5 |
| (2-chloroethyl)benzene | 19.3 | 6.3 | 2.2 | 200 | 622-24-2 |
| 1-chloronaphthalene | 20.5 | 4.9 | 2.5 | 263 | 90-13-1 |
| 2-chlorostyrene | 18.7 | 4.7 | 3.9 | 187 | 2039-87-4 |
| 4-chlorostyrene | 18.7 | 4.3 | 3.9 | 189 | 1073-67-2 |
| 2-chlorotoluene | 19.0 | 4.9 | 2.3 | 159 | 95-49-8 |
| 1,8-cineole | 16.7 | 4.6 | 3.4 | 176 | 470-82-6 |
| cis-decahydronaphthalene | 17.6 | 0.0 | 0.0 | 193 | 493-01-6 |
| cyclodecanone | 16.8 | 8.0 | 4.1 | 236 | 1502-06-3 |
| cycloheptanone | 17.2 | 10.6 | 4.8 | 180 | 502-42-1 |
| 1,2-cyclohexanedione | 18.6 | 10.3 | 8.0 | 194 | 765-87-7 |
| cyclohexanone | 17.8 | 8.4 | 5.1 | 157 | 108-94-1 |
| cyclohexylbenzene | 18.7 | 0.0 | 1.0 | 236 | 827-52-1 |
| chlorocyclohexane | 17.3 | 5.5 | 2.0 | 143 | 542-18-7 |
| cyclooctanone | 17.0 | 9.6 | 4.5 | 193 | 502-49-8 |
| decane | 15.7 | 0.0 | 0.0 | 174 | 124-18-5 |
| 1-decene | 15.8 | 1.0 | 2.2 | 171 | 872-05-9 |
| di (2-chloroethoxy)methane | 17.1 | 10.2 | 7.1 | 218 | 111-91-1 |
| bis (2-chloroethyl) ether | 18.8 | 9.0 | 5.7 | 178 | 111-44-4 |
| bis (2-chloroisopropyl) ether | 19.0 | 8.2 | 5.1 | 187 | 108-60-1 |
| diethylene glycol dimethyl ether | 15.7 | 6.1 | 6.5 | 162 | 111-96-6 |
| 1,1-diallyloxy ethane | 15.4 | 5.1 | 4.8 | 148 | 20682-69-3 |
| 1,2-dibromobenzene | 20.7 | 6.5 | 5.3 | 224 | 583-53-9 |
| dibutyl ketone | 16.0 | 7.7 | 4.4 | 186 | 502-56-7 |
| 3,4-dichlorobenzotrifluoride | 20.0 | 4.7 | 2.4 | 173 | 328-84-7 |
| 2,6-dichlorofluorobenzene | 19.4 | 9.1 | 2.7 | 171 | 2268-05-5 |
| 2,6-dichloroanisole | 19.8 | 8.4 | 6.5 | 212 | 1984-65-2 |

TABLE 3

Preferred Specific Examples of Organic Solvents A and B

| Solvents | Dispersion Term (δD) | Polar Term (δP) | Hydrogen Bonding Term (δH) | Boiling Point (° C.) | CAS No. |
|---|---|---|---|---|---|
| 1,3-dichlorobenzene | 19.2 | 5.1 | 2.7 | 172 | 541-73-1 |
| 1,2-dichlorobenzene | 19.2 | 6.3 | 3.3 | 180 | 95-50-1 |
| 1,4-dichlorobenzene | 19.7 | 5.6 | 2.7 | 174 | 106-46-7 |
| 3,4-dichlorotoluene | 19.8 | 9.8 | 2.5 | 205 | 95-75-0 |
| 1,1-diethoxybutane | 15.4 | 4.9 | 4.6 | 144 | 3658-95-5 |
| 2,3-diethoxytetrahydrofuran | 16.6 | 6.4 | 7.3 | 164 | 3320-90-9 |
| 1,4-diethylbenzen | 18.0 | 0.0 | 0.6 | 184 | 105-05-5 |
| diethyl malonate | 16.1 | 7.7 | 8.3 | 199 | 105-53-3 |
| diethyl oxalate | 16.2 | 8.0 | 8.8 | 185 | 95-92-1 |
| diethylene glycol monobutyl ether acetate | 16.0 | 4.1 | 8.2 | 247 | 124-17-4 |
| diethylene glycol dibutyl ether | 15.8 | 4.7 | 4.4 | 255 | 112-73-2 |
| diethylene glycol diethyl ether | 15.8 | 5.9 | 5.6 | 188 | 112-36-7 |
| diethylene glycol divinyl ether | 16.0 | 7.3 | 7.9 | 197 | 764-99-8 |
| diethylene glycol monohexyl ether | 16.0 | 6.0 | 10.0 | 258 | 112-59-4 |
| diethylene glycol monoethyl ether acetate | 16.2 | 5.1 | 9.2 | 218 | 112-15-2 |
| hexyl ether | 16.0 | 3.0 | 2.8 | 226 | 112-58-3 |
| diisobutyl ketone | 16.0 | 3.7 | 4.1 | 168 | 108-83-8 |
| 1,2-dimethoxybenzene | 19.2 | 4.4 | 9.4 | 207 | 91-16-7 |
| dibutyl ether | 15.2 | 3.4 | 3.2 | 141 | 142-96-1 |
| amyl ether | 15.6 | 3.1 | 3.0 | 186 | 693-65-2 |
| dipentene | 17.2 | 1.8 | 4.3 | 178 | 138-86-3 |
| phenyl ether | 19.4 | 3.4 | 4.0 | 258 | 101-84-8 |
| 4-heptanone | 15.8 | 7.6 | 4.9 | 143 | 123-19-3 |
| dodecane | 16.0 | 0.0 | 0.0 | 216 | 112-40-3 |
| 4'-ethoxyacetophenone | 18.8 | 10.3 | 6.4 | 269 | 1676-63-7 |
| ethyl 3-ethoxypropionate | 16.2 | 3.3 | 8.8 | 170 | 763-69-9 |
| ethyl amyl ketone | 16.2 | 4.5 | 4.1 | 167 | 106-68-3 |
| ethyl caproate | 15.5 | 3.2 | 5.9 | 168 | 123-66-0 |
| octyl acetate | 15.8 | 2.9 | 5.1 | 200 | 103-09-3 |
| 2-ethylhexyl acrylate | 15.3 | 4.3 | 3.0 | 215 | 103-11-7 |
| ethylene glycol monobutyl ether acetate | 15.3 | 7.5 | 6.8 | 192 | 112-07-2 |
| ethylene glycol butyl ethyl ether | 15.3 | 4.9 | 4.6 | 161 | 4413-13-2 |
| ethylene glycol methyl butyl ether | 15.5 | 5.2 | 4.9 | 149 | 13343-98-1 |
| ethylene glycol diacetate | 16.2 | 4.7 | 9.8 | 190 | 111-55-7 |

TABLE 4

Preferred Specific Examples of Organic Solvents A and B

| Solvents | Dispersion Term (δD) | Polar Term (δP) | Hydrogen Bonding Term (δH) | Boiling Point (° C.) | CAS No. |
|---|---|---|---|---|---|
| ethylene glycol dibutyl ether | 15.7 | 4.5 | 4.2 | 202 | 112-48-1 |
| ethylene glycol di-tert-butyl ether | 14.7 | 4.1 | 8.2 | 171 | 26547-47-7 |
| β-pinene | 16.9 | 1.5 | 3.1 | 157 | 471-84-1 |
| 4-fluoroanisole | 18.7 | 7.3 | 6.7 | 157 | 459-60-9 |
| 4-fluoropropiophenone | 19.6 | 7.1 | 3.5 | 230 | 582-83-2 |
| triacetin | 16.5 | 4.5 | 9.1 | 260 | 102-76-1 |
| glycidyl methacrylate | 16.3 | 8.5 | 5.7 | 189 | 106-91-2 |
| heptyl acetate | 15.8 | 2.9 | 5.5 | 192 | 112-06-1 |
| hexachloroacetone | 18.3 | 3.0 | 3.0 | 202 | 116-16-5 |
| hexamethyl benzene | 19.2 | 1.6 | 0.0 | 264 | 87-85-4 |
| hexyl acetate | 15.8 | 2.9 | 5.9 | 169 | 142-92-7 |
| 1,6-diacetoxyhexane | 15.3 | 4.5 | 7.2 | 260 | 6222-17-9 |
| indene | 18.7 | 2.6 | 9.0 | 180 | 95-13-6 |
| iodobenzene | 19.9 | 5.6 | 6.1 | 138 | 591-50-4 |
| isoamyl acetate | 15.3 | 3.1 | 7.0 | 142 | 123-92-2 |
| isoamyl propionate | 15.7 | 5.2 | 5.6 | 161 | 105-68-0 |
| isobutyl isobutyrate | 15.1 | 2.8 | 5.8 | 147 | 97-85-8 |
| isophozone | 17.0 | 8.0 | 5.0 | 215 | 78-59-1 |
| cumene | 18.1 | 1.2 | 1.2 | 155 | 98-82-8 |
| (+)-limonene | 17.2 | 1.8 | 4.3 | 176 | 5989-27-5 |
| (−)-menthol | 16.0 | 4.7 | 9.0 | 216 | 2216-51-5 |
| (−)-menthone | 17.0 | 8.1 | 4.4 | 207 | 10458-14-7 |
| (−)-menthyl acetate | 16.8 | 4.7 | 4.9 | 228 | 2623-23-6 |
| mesitylene | 18.0 | 0.6 | 0.6 | 164 | 108-67-8 |
| 4'-methoxyacetophenone | 18.9 | 11.2 | 7.0 | 260 | 100-06-1 |
| 3-methoxybutyl acetate | 15.3 | 4.1 | 8.1 | 172 | 4435-53-4 |

TABLE 4-continued

Preferred Specific Examples of Organic Solvents A and B

| Solvents | Dispersion Term (δD) | Polar Term (δP) | Hydrogen Bonding Term (δH) | Boiling Point (° C.) | CAS No. |
|---|---|---|---|---|---|
| 4-methoxy-4-methyl-2-pentanone | 15.3 | 6.0 | 5.9 | 156 | 107-70-0 |
| 4-methyl-2-pentyl acetate | 15.2 | 3.1 | 6.8 | 144 | 108-84-9 |
| methyl benzoate | 18.9 | 8.2 | 4.7 | 200 | 93-58-3 |
| 2-methylcyclohexanone | 17.6 | 7.8 | 4.7 | 165 | 583-60-8 |
| 3-methylcyclohexanone | 17.7 | 7.7 | 4.7 | 169 | 591-24-2 |
| isoamyl methyl ketone | 16.0 | 5.7 | 4.1 | 144 | 110-12-3 |
| 2-heptanone | 16.2 | 5.7 | 4.1 | 151 | 110-43-0 |
| 1-methylnaphthalene | 19.7 | 0.8 | 4.7 | 241 | 90-12-0 |

TABLE 5

Preferred Specific Examples of Organic Solvents A and B

| Solvents | Dispersion Term (δD) | Polar Term (δP) | Hydrogen Bonding Term (δH) | Boiling Point (° C.) | CAS No. |
|---|---|---|---|---|---|
| α-methylstyrene | 18.5 | 2.4 | 2.4 | 162 | 98-83-9 |
| Methyl p-toluate | 19.0 | 6.5 | 3.8 | 216 | 99-75-2 |
| nonane | 15.7 | 0.0 | 0.0 | 150 | 111-84-2 |
| 1-nonene | 15.4 | 1.0 | 2.2 | 147 | 124-11-8 |
| n-octyl acetate | 15.8 | 2.9 | 5.1 | 210 | 112-14-1 |
| pentyl propionate | 15.8 | 5.2 | 5.7 | 169 | 624-54-4 |
| phenetole | 18.4 | 4.5 | 4.0 | 173 | 103-73-1 |
| phenyl acetate | 19.8 | 5.2 | 6.4 | 195 | 122-79-2 |
| phenylacetylene | 18.8 | 2.8 | 4.0 | 142 | 536-74-3 |
| 2-pinene | 16.9 | 1.8 | 3.1 | 155 | 80-56-8 |
| (+)-pulegone | 17.5 | 8.9 | 5.5 | 217 | 89-82-7 |
| styrene | 18.6 | 1.0 | 4.1 | 145 | 100-42-5 |
| 1,2,4,5-tetrachlorobenzene | 21.2 | 10.7 | 3.4 | 246 | 95-94-3 |
| tetradecane | 16.2 | 0.0 | 0.0 | 253 | 629-59-4 |
| 1-tetradecane | 16.1 | 0.5 | 1.9 | 251 | 1120-36-1 |
| tetralin | 19.6 | 2.0 | 2.9 | 207 | 119-64-2 |
| 1,2,3,4-tetramethylbenzene | 18.8 | 0.5 | 0.5 | 205 | 488-23-3 |
| 1,2,3,5-tetramethylbenzene | 18.6 | 0.5 | 0.5 | 198 | 527-53-7 |
| trans-decahydronaphthalene | 18.0 | 0.0 | 0.0 | 185 | 493-02-7 |
| 2,4,6-trichloroanisole | 21.0 | 3.9 | 7.0 | 240 | 87-40-1 |
| 1,2,4-trichlorobenzene | 20.2 | 4.2 | 3.2 | 213 | 120-82-1 |
| tricyclene | 16.9 | 0.0 | 0.0 | 152 | 508-32-7 |
| 1,2,4-trimethylbenzene | 18.0 | 1.0 | 1.0 | 169 | 95-63-6 |
| undecan | 16.0 | 0.0 | 0.0 | 195 | 1120-21-4 |
| 2-ethylhexyl vinyl ether | 15.6 | 3.4 | 4.2 | 177 | 103-44-6 |
| vinyl carbitol ether | 15.9 | 6.0 | 6.6 | 189 | 10143-53-0 |
| 2-methylstyrene | 18.6 | 1.0 | 3.8 | 171 | 611-15-4 |
| o-xylene | 17.8 | 1.0 | 3.1 | 145 | 95-47-6 |
| 2-methyanisole | 18.6 | 4.4 | 6.6 | 172 | 578-58-5 |
| 3-methyanisole | 18.9 | 3.2 | 6.2 | 177 | 100-84-5 |
| 4-methyanisole | 18.8 | 5.7 | 6.3 | 175 | 104-93-8 |
| ethyl benzoate | 17.9 | 6.2 | 6.0 | 211 | 93-89-0 |
| 3,5-dimethylanisole | 18.9 | 4.2 | 7.5 | 193 | 874-63-5 |
| 1-phenoxy-2-propanol | 17.9 | 6.9 | 13.9 | 243 | 770-35-4 |

The organic solvent A and the organic solvent B are not limited to the preferred specific examples described above, and solvents may be selected appropriately according to the types of the organic semiconductor compound and the insulation compound within the range that various conditions are satisfied.

The content mass ratio a:b (organic solvent A:organic solvent B) of the organic solvent A to the organic solvent B in the organic semiconductor composition of the present invention is preferably 1:8 to 8:1, more preferably 1:6 to 6:1, further preferably 1:5 to 5:1, particularly preferably 1:5 to 2:1, and most preferably 1:1.

The manufacturing method of the organic-semiconductor composition of the present invention is not limited, well-known methods are applicable. For example, desired compositions can be obtained by sequentially adding specified amounts of the organic semiconductor compound and the insulation compound to a mixed solvent of the organic solvent A and the organic solvent B and appropriately performing a stirring process.

The organic thin film (organic semiconductor film) of the present invention can be obtained by applying or printing the organic semiconductor composition on a substrate to form the organic semiconductor composition layer and then subjecting the composition layer to the heat treatment. Conventional methods can be adopted for the application or printing without limitation. Further, the method and conditions of the heat treatment are not particularly limited, as long as the organic solvents A and B can be evaporated, but the heat treatment under reduced pressure is preferable in order to lower the dry temperature.

The organic thin film transistor of the present invention has two electrodes (source electrode and drain electrode) in contact with the organic semiconductor film of the present invention, and the current flow between the electrodes is controlled by a voltage applied to another electrode called a gate electrode.

In the organic thin film transistor device, a structure (Metal-Insulator-Semiconductor MIS structure) in which the gate electrode is insulated by an insulation film is generally used. A structure using a metal oxide film as an insulation film is called a MOS structure, and in addition, a structure in which a gate electrode is formed via a Schottky barrier (i.e. MES structure) is also known, however the MIS structure is often used in the case of the organic thin film transistor.

Hereinafter, the organic transistor will be described in more detail using some aspects of the organic transistor device shown in FIG. 1, but the present invention is not limited to these structures.

In the aspects in FIG. 1, reference number 1 represents a source electrode, reference number 2 represents an organic thin film (organic semiconductor layer), reference number 3 represents a drain electrode, reference number 4 represents an insulation layer, reference number 5 represents a gate electrode, and reference number 6 represents a substrate, respectively. Positioning of the layer or the electrodes can be appropriately selected according to the applications of the device. A to D and F are called horizontal transistor because current flows in a direction parallel to the substrate. A is called a bottom contact-bottom gate structure and B is called a top contact-bottom gate structure. C is provided with a source electrode and drain electrode and an insulation layer on a semiconductor, and a gate electrode is further formed thereon, which is called a top contact-top gate structure. D is a structure called a top and bottom contact bottom gate type transistor. F is a bottom contact-top gate structure. E is a schematic diagram of a transistor having a vertical structure, in other words, a static induction transistor (SIT). As for the SIT, many carriers can move at one time because the current flow spreads flat. In addition, since the source electrode and the drain electrode are vertically disposed, the distance between the electrodes can be reduced for the response to be fast. Therefore, the SIT can be preferably applied to applications such as large current flowing or high-speed switching. Although a substrate is not described in E in FIG. 1, the substrate is usually provided outside the source electrode or the drain electrode represented by reference numbers 1 and 3 in FIG. 1E.

Components in the aspects will be described.

The substrate 6 is required to keep the layers formed thereon without peeling off. Examples of substrates which can be used include the insulation materials such as resin plate or film, paper, glass, quartz, and ceramic; a conductive substrate such as metal or alloy by coating on which the insulation layer is formed; materials comprising various combinations such as resin and inorganic materials. Examples of the resin film which can be used include polyethylene terephthalate, polyethylene naphthalate, polyether sulfone, polyamide, polyimide, polycarbonate, cellulose triacetate and polyether imide. Flexibility can be added to the device when resin films or papers are used, thereby making the device flexible and lightweight, resulting in improvement of practicability. The thickness of the substrate is usually 1 μm to 10 mm, preferably 5 μm to 5 mm.

Materials having conductivity are used for source electrode 1, drain electrode 3, and gate electrode 5. Examples of materials which can be used include metals such as platinum, gold, silver, aluminum, chromium, tungsten, tantalum, nickel, cobalt, copper, iron, lead, tin, titanium, indium, palladium, molybdenum, magnesium, calcium, barium, lithium, potassium and sodium, and alloys containing thereof; conductive oxides such as $InO_2$, $ZnO_2$, $SnO_2$ and ITO; conductive polymers such as polyaniline, polypyrrole, polythiophene, polyacetylene, polyparaphenylene vinylene and polydiacetylene; semiconductors such as silicon, germanium and gallium arsenide; carbon materials such as carbon black, fullerene, carbon nanotube, graphite and graphene; and so on. Doping may be performed on the conductive polymer compound and the semiconductor. As for a dopant, examples include inorganic acids such as hydrochloric acid and sulfuric acid; organic acids having an acidic functional group such as sulfonic acid; Lewis acids such as $PF_5$, $AsF_5$ and $FeCl_3$; halogen atoms such as iodine; metals such as lithium, sodium and potassium; and so on. Boron, phosphorus and arsenic, etc. are also widely used as a dopant for inorganic semiconductor such as silicon.

Conductive composite materials in which carbon black, metal particles etc. are dispersed in the above-described dopant are also used. As for the source electrode 1 and the drain electrode 3 which are directly in contact with the semiconductor, selecting an appropriate work function or conducting the surface treatment etc. are important in order to reduce the contact resistance.

The distance between the source electrode and the drain electrode (channel length) is an important factor that determines the characteristics of the device, so an appropriate channel length is required. When the channel length is short, the current amount which can be taken out increases, but a short channel effect such as the influence of contact resistance may occur to degrade the semiconductor characteristics. The channel length is usually 0.01 to 300 μm, preferably 0.1 to 100 μm. The width between the source electrode and the drain electrode (channel width) is usually 10 to 5000 μm, preferably 40 to 2000 μm. The channel width can form a longer channel width by making the electrode structure into a comb structure etc., and an appropriate length is needed according to the necessary current amount and the device structure.

The structure (shape) of the source electrode and the drain electrode will be described. The structures of the source electrode and the drain electrode may be the same or different.

In the case of the bottom contact structure, forming electrodes using a lithography method, and forming the electrode in a cuboid shape are generally preferable. Recently, printing quality provided by various printing methods is improved, and an electrode can be manufactured at high quality using techniques such as inkjet printing, gravure printing or screen printing. In the case of the top contact structure having an electrode on the semiconductor, vapor deposition can be performed by methods such as a shadow mask etc. Direct printing of electrode patterns can also be conducted using techniques such as inkjet. The length of the electrode is the same as the channel width described above. The width of the electrode is not particularly limited, but is preferably shorter to reduce the area of the device in arrange that the electrical characteristics can be stabilized. The width of the electrode is usually 0.1 to 1000 μm, preferably 0.5 to 100 μm. The thickness of the electrode is usually 0.1 to 1000 nm, preferably 1 to 500 nm, more preferably 5 to 200 nm. Wire is connected to electrodes 1, 3 and 5, but the wire is also made of substantially the same material as the electrodes.

As for insulation layer 4, materials having insulation properties is used. Examples which may be used include polymers such as polyparaxylylene, polyacrylate, polymethyl methacrylate, polystyrene, polyvinyl phenol, polyamide, polyimide, polycarbonate, polyester, polyvinyl alcohol, polyvinyl acetate, polyurethane, polysulfone, polysiloxane, fluorine resin, epoxy resin, phenol resin and copolymers thereof, metal oxides such as silicon oxide, aluminum oxide, titanium oxide and tantalum oxide, ferroelectric metal oxides such as $SrTiO_3$ and $BaTiO_3$, nitrides such as silicon nitride and aluminum nitride, dielectrics such as sulfide or fluoride, or polymers in which particles of these dielectrics are dispersed etc. The insulation layer having high electrical insulation properties can be preferably used in order to reduce the leakage current. As a result, the film thickness of the thin film can be reduced, the insulation capacity can be increased to increase the current which can be extracted. Reducing the surface energy of the insulation layer to make a smooth film without unevenness are preferable in order to improve the mobility of the semiconductor. Therefore, a self-assembled monomolecular film or a two-layer insulation layer consisting of two layers may be formed. The film thickness of insulation layer 4 varies depending on the material, but is usually 0.1 nm to 100 μm, preferably 0.5 nm to 50 μm, and more preferably 1 nm to 10 μm.

The organic semiconductor composition of the present invention is used for the material of the semiconductor layer 2. An organic semiconductor film can be formed by a method according to the method for forming the organic semiconductor film described above to make semiconductor layer 2.

Two or more layers may be formed for the semiconductor layer (organic thin film), but a single layer structure is more preferable. The film thickness of semiconductor layer 2 is preferably as thin as possible in the range that the necessary functions are not lost. In horizontal organic transistors as shown in A, B and D, the device characteristics do not depend on the film thickness when the film thickness is more than a required value. The leakage current often increases as the film thickness increases. The film thickness of the semiconductor layer for exhibiting the necessary function is usually 1 nm to 1 μm, preferably 5 nm to 500 nm, more preferably 10 nm to 300 nm.

In the organic thin film transistor, another layer can be provided as needed, for example, between the substrate layer and the insulation film layer, between the insulation film layer and the semiconductor layer, or on the outer surface of the device. For example, when a protective layer is formed directly on the organic thin film or through another layer, the influence of external atmosphere such as humidity can be reduced. Also, as another advantage, electrical characteristics can be stabilized, such as the on/off ratio of the organic transistor device can be increased.

The material of the protective layer is not particularly limited, for example, films made of various resins such as epoxy resin, acrylic resins including polymethyl methacrylate, polyurethane, polyimide, polyvinyl alcohol, fluorine resin and polyolefin etc., inorganic oxide films such as silicon oxide, aluminum oxide and silicon nitride etc.; and films made of a dielectric such as nitride film; etc. are preferably used, a resin (polymer) having a low permeability of oxygen and moisture and a low water absorption ratio are particularly preferable. Gas barrier protective materials developed for organic EL displays can also be used. Although the film thickness of the protective layer can be optionally selected film thickness according to the purpose, the thickness is usually 100 nm to 1 mm.

Performing the surface modification or the surface treatment in advance to a substrate or an insulation layer which the organic thin film is laminated on can improve the characteristics relating to an organic transistor device. For example, adjusting the degree of hydrophilicity/hydrophobicity of the substrate surface can improve the film quality and the film forming property of the film to be formed thereon. In particular, the characteristics of the organic semiconductor material may greatly change depending on the state of the film such as the orientation of molecules. Therefore, the characteristics such as carrier mobility is considered to be improved by the surface treatment to the substrate or the insulation layer etc. by controlling the molecular orientation at the interface with the organic thin film to be formed later, or by reducing the trap site on the substrate or the insulation layer.

Trap site means a functional group such as hydroxyl group on an untreated substrate. When such the functional group is present, electrons are attracted to the functional group, resulting in decreasing carrier mobility. Therefore, reducing the trap site is often effective in improving the characteristics such as carrier mobility.

As the surface treatment for the characteristic improvement mentioned above, examples include self-assembled monomolecular film treatment using hexamethyl disilazane, octyltrichlorosilane, octadecyltrichlorosilane etc., the surface treatment with polymer etc., acid treatment with hydrochloric acid and sulfuric acid, acetic acid etc., alkali treatment with sodium hydroxide, potassium hydroxide, calcium hydroxide, ammonia etc., ozone treatment, fluorination treatment, plasma treatment with oxygen or argon etc., film formation treatment of Langmuir-Blodgett film or other thin film formation treatments of insulators and semiconductors, mechanical treatment, electrical treatment such as corona discharge, rubbing treatment using fibers etc. and the combination treatment of these treatments can also be performed.

In these aspects, for example, the vacuum process and the solution process described above can be appropriately adopted as a method of providing the layer such as a substrate layer and an insulation film layer, an insulation film layer and an organic thin film.

Next, a method of manufacturing an organic thin film transistor device of the present invention will be described below based on FIG. 2 by taking the top contact bottom gate type organic transistor shown in the aspect example B in FIG. 1 as an example. The manufacturing method is applicable to the organic transistors of the other aspects described above in the same manner.

(Substrate and Substrate Processing of Organic Transistor)

The organic transistor of the present invention is manufactured by providing various layers and electrodes necessary on the substrate 6 (see FIG. 2 (1)). As a substrate, the substrates described above can be used. The surface treatment described above etc. can be performed on the substrate. The thickness of the substrate 6 is preferably as thin as possible without interfering the necessary functions. Depending on the material, the thickness is usually 1 μm to 10 mm, preferably 5 μm to 5 mm. Also, the substrate can be made to have the function of an electrode as needed.

(Formation of Gate Electrode)

The gate electrode 5 is formed on the substrate 6 (see FIG. 2 (2)). As an electrode material, the electrode material described above are used. Various methods can be used as a method of forming the electrode film, examples include vacuum evaporation method, sputtering method, application method, thermal transfer method, printing method, sol-gel method etc. At the time of film formation or after thereof, performing patterning to obtain a desired shape is preferable as needed. Various methods can be used as patterning method, examples include photolithography method in which patterning of photoresist and etching are combined. In addition, patterning can be performed by methods such as evaporation method using shadow mask, sputtering method, printing methods such as inkjet printing, screen printing, offset printing, letterpress printing, soft lithography such as micro contact printing method, and methods combining two or more of these methods. The film thickness of the gate electrode 5 varies depending on the material, but is usually 0.1 nm to 10 µm, preferably 0.5 nm to 5 µm, and more preferably 1 nm to 3 µm. In the case of that the substrate serves as the gate electrode, the film thickness may be larger than the above film thickness.

(Formation of Insulation Layer)

Insulation layer 4 is formed on the gate electrode 5 (see FIG. 2 (3)). As an insulation material, the material described above are used. Various methods can be used to form insulation layer 4. Examples include application methods such as spin coating, spray coating, dip coating, casting, bar coating and blade coating, printing methods such as screen printing, offset printing and inkjet printing, dry process methods such as vacuum evaporation method, molecular beam epitaxial growth method, ion cluster beam method, ion plating method, sputtering method, atmospheric pressure plasma method and CVD method. In addition, sol-gel methods or methods of forming an oxide film on a metal by thermal oxidation method etc., such as alumite on aluminum, and silicon oxide on silicon, etc., are adopted. In the portion where the insulation layer and the semiconductor layer are in contact with each other, the insulation layer may be subjected to the surface treatment in order to orient the molecules of the compound constituting the semiconductor at the interface between both layers. As a surface treatment method, the surface treatment of the substrate may be used in the same manner. The film thickness of insulation layer 4 is preferably as thin as possible, because the electric quantity taken out can be increased by raising the electric capacity. At the time, the leak current increases when the film is thin, so, the film is preferably as thin as possible without losing the function thereof. The thickness of film is usually 0.1 nm to 100 µm, preferably 0.5 nm to 50 µm, and more preferably 5 nm to 10 µm.

(Formation of Organic Thin Film)

Various methods such as application and printing may be used to form the organic thin film (organic semiconductor layer). Specific examples include application methods such as dip coating method, die coater method, roll coater method, bar coater method and spin coating method, forming method with solution process such as inkjet method, screen printing method, offset printing method and micro contact printing method.

A method of forming an organic thin film by solution process will be described. The organic semiconductor composition is applied to a substrate (exposed portion of insulation layer, source electrode and drain electrode). Examples of application methods include spin coating method, drop casting method, dip coating method, spray method, flexographic printing method, letterpress printing method such as resin letterpress printing method, offset printing method, dry offset printing method, flat printing methods such as pad printing method, intaglio printing methods such as gravure printing method, silk screen printing method, mimeograph printing method, stencil printing methods such as lithographic printing method, ink jet printing method, micro contact printing method, etc., and further, and methods combining two or more of these methods.

Furthermore, methods similar to the application method which can be also adopted include Langmuir-Blodgett method in which a monomolecular film of an organic thin film obtained by dropping the above composition onto water surface is transferred onto a substrate and laminating the film, and method in which materials in liquid crystal or melt state are sandwiched between two substrates and introduced into a space between two substrates by capillary phenomenon.

Since the environment such as the temperature of the substrate and the composition during film formation is also important, and the characteristics of the transistor may vary depending on the temperature of the substrate and the composition. Therefore, the temperature of the substrate and composition is preferably carefully selected. The substrate temperature is usually 0 to 200° C., preferably 10 to 120° C., more preferably 15 to 100° C. Because the temperature largely depends on the solvent etc. in the composition to be used, a careful attention is required.

The film thickness of the organic thin film manufactured by the above method is preferably as thin as possible without losing the necessary function. When a film thickness increases, the leakage current may increase. The thickness of the organic thin film is usually 1 nm to 1 µm, preferably 5 nm to 500 nm, more preferably 10 nm to 300 nm.

The organic thin film thus formed (see FIG. 2 (4)) can be further improved in properties by the post-treatment. For example, improvement or stabilization of the organic semiconductor properties can be obtained by the heat treatment which causes reduction of the strain in the film generated during film formation or reduction of pinholes etc., or control of the alignment and orientation in the film. The heat treatment is effective for improving the properties when the organic transistor of the present invention is manufactured. The heat treatment is performed by heating the substrate after forming the organic thin film. Although the heat treatment temperature is not particularly limited, usually from room temperature to about 180° C., preferably 40 to 160° C., more preferably 45 to 150° C. At the time, the heat treatment time is not particularly limited, but it is usually about 10 seconds to 24 hours, preferably about 30 seconds to 3 hours. In the heat treatment, the atmosphere may be in the air, but the heat treatment may be performed under an inert atmosphere such as nitrogen or argon. In addition, controlling of the film shape by solvent vapor, etc. can be performed.

As another post-treatment method for the organic thin film, the treatment may be performed using oxidizing or reducing gases such as oxygen or hydrogen, or oxidizing or reducing liquids to induce property change by oxidation-reduction reaction. The gases or the liquids can be used, for example, for the purpose of increasing or decreasing the carrier density in the film.

In a method called doping, the properties of the organic thin film can be changed by adding trace elements, atomic groups, molecules, and polymers to the organic thin film. Examples of dopant include oxygen, hydrogen, acids such as hydrochloric acid, sulfuric acid and sulfonic acid; Lewis acids such as $PF_5$, $AsF_5$ and $FeCl_3$, halogen atoms such as iodine, metal atoms such as sodium and potassium, donor compounds such as tetrathiafulvalene (TTF) and phthalocyanine. The doping process can be achieved by bringing the organic thin film into contact with the above gases, immersing the film in solutions, or performing an electrochemical doping process. These dopants can be added even not only after the formation of the organic thin film, but also at the time of synthesis of the organic semiconductor compound. These dopants can be added to the organic semiconductor composition, or added in the step of forming the organic thin film. In addition, dopants can be added to the material forming the organic thin film at the time of deposition to perform co-evaporation, or the dopants can be mixed with the surrounding atmosphere when producing the organic thin film (producing the organic thin film under the environment in which the dopant is present), and further, doping can be performed by acceleration of the ions in vacuum and collision to the film.

Examples of the effects of the doping include changes of electrical conductivity due to increase or decrease of carrier density, changes of carrier polarity (p-type, n-type), and changes of Fermi level etc.

(Formation of Source Electrode and Drain Electrode)

The source electrode 1 and the drain electrode 3 can be formed according to the method for forming the gate electrode 5 (see FIG. 2 (5)). Further, various additives etc., can be used to reduce the contact resistance with the organic thin film.

(Protective Layer)

Forming the protective layer 7 on the organic thin film has the advantage that the influence of external atmosphere is minimized and that the electrical properties of the organic transistor are stabilized (see FIG. 2 (6)). The materials described above are used as a material of the protective layer. The film thickness of the protective layer 7 can be appropriately determined according to the purpose, but the thickness is usually 100 nm to 1 mm.

Various methods may be adopted for forming the protective layer. In the case of that the protective layer is made of resins, examples include methods of applying a resin solution and then drying thereof to form a resin film; and methods of applying or vapor depositing a resin monomer and then polymerizing. After film formation, crosslinking may be performed. In the case that the protective layer is made of inorganic substances, examples include such as methods of forming with vacuum processes such as sputtering method and evaporation method, or methods of forming with by solution process such as sol-gel method.

In the organic thin film transistor, a protective layer can be provided as needed between layers in addition to on the organic thin film. These layers may help to stabilize the electrical properties of the organic transistor.

The organic thin film transistor can be manufactured by a relatively low temperature process, because the organic semiconductor compound is used as an organic semiconductor composition. Therefore, flexible materials such as plastic plates and plastic films which cannot be used under exposure to high temperature can also be used as a substrate. As a result, a device having lightweight, excellent flexibility and durability can be manufactured and used as an active matrix switching device of the display.

The organic thin film transistors can also be used as a digital device and an analog device such as a memory circuit device, a signal driver circuit device, and a signal processing circuit device. By combining the above devices, displays, IC cards, IC tags etc., can be manufactured. Furthermore, the organic transistor can be used as a sensor, because the properties can be changed by external stimulus, for example, by a chemical material.

EXAMPLES

Hereinafter, the present invention will be described in detail by way of the Examples, but the present invention is not limited thereto.

In the Examples, OSC-1(9-octyl-3-phenylnaphtho[2',3':4,5]thieno[3,2-b][1]benzothiophene) represented by the following formula (6), OSC-2 (6,13-bis(triisopropylsilylethynyl)pentacene) represented by the following formula (7), and OSC-3(2,7-dioctyl[1]benzothieno[3,2-b][1] benzothiophene) represented by the following formula (8), were used as an organic semiconductor compound.

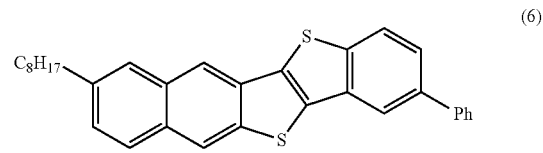

(6)

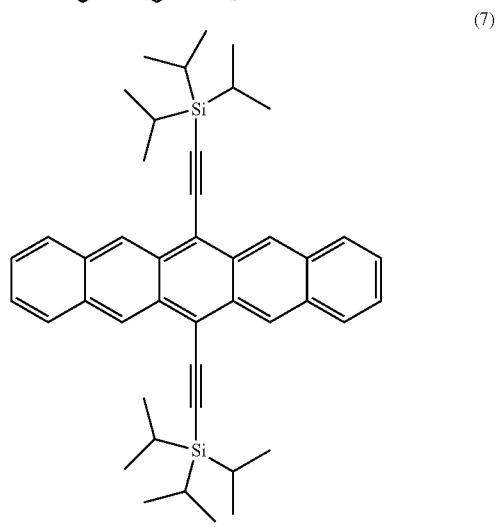

(7)

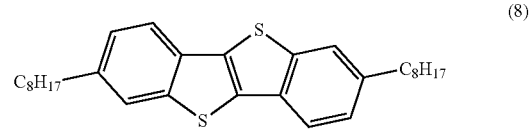

(8)

Reference Example 1 (Evaluation of Solubility)

Each solvent listed in Table 6 below was added to about 1 mg of OSC-1 powder to calculate the solubility (mass of OSC-1/mass of each solution required to dissolve all OSC-1×100). The determination as to whether the dissolution is completed was made based on visual judgement. The results are shown in Table 6. The solubility of the polymethyl methacrylate (hereinafter, PMMA) and polystyrene (hereinafter, PS) used in the Examples as an insulation compound were also evaluated in the same manner. The results are shown in Table 6 and Table 7.

The solubility of OSC-2 to OSC-3 were evaluated in the same manner, and the results are shown in Table 8 and 9.

TABLE 6

Evaluation of Solubility

| Solvents | Solubility (OSC-1)/% | Solubility |
|---|---|---|
| anisole | 0.4 | 1.0 |
| 4-methoxytoluene | 0.5 | 0.5 |
| phenetole | 0.4 | 0.5 |
| phenyl acetate | 0.3 | 0.5 |
| tetralin | 0.5 | <0.05 |
| cyclohexylbenzene | 0.1 | <0.05 |

TABLE 7

Evaluation of Solubility

| Solvents | Solubility (OSC-1)/% | Solubility (PS)/% |
|---|---|---|
| o-xylene | 0.5 | 0.8 |
| 1-phenoxy-2-propanol | 0.05 | 0.05 |

TABLE 8

Evaluation of Solubility

| Solvents | Solubility (OSC-2)/% | Solubility (PS)/% |
|---|---|---|
| anisole | 0.3 | 1.0 |
| tetralin | >1.0 | <0.05 |

TABLE 9

Evaluation of Solubility

| Solvents | Solubility (OSC-3)/% | Solubility (PS)/% |
|---|---|---|
| anisole | 1.0 | 1.0 |
| tetralin | >1.0 | <0.05 |

Reference Example 2 (Calculation of Hansen Solubility Parameter of Insulation Compounds (PMMA and PS))

Hansen solubility parameters of PMMA and PS were calculated according to the method described in the above. The results are shown in Table 10.

TABLE 10

Solubility Parameter of Insulating Compounds

|  | Dispersion Term (δD) | Polar Term (δP) | Hydrogen Bonding Term (δH) |
|---|---|---|---|
| PMMA | 18.6 | 10.5 | 5.1 |
| PS | 18.5 | 4.5 | 2.9 |

Example 1 (Preparation of Organic Semiconductor Composition 1 of the Present Invention)

Organic semiconductor composition 1 was prepared by adding and dissolving OSC-1 and PMMA (Aldrich Corp., molecular weight 120,000) in an amount such that concentration are 0.3% and 0.016% respectively with respect to a mixed solution in which anisole (Tokyo Chemical Industry Co., Ltd.) and tetralin (Tokyo Chemical Industry Co., Ltd.) were mixed at a ratio of a:b=1:1. The difference of a hydrogen bonding term in the solubility parameters between anisole and PMMA was 1.8 cal/cm$^3$, and the difference of a hydrogen bonding term in the solubility parameters between tetralin and PMMA was 2.2 cal/cm$^3$. The properties of the organic semiconductor composition 1 including the other physical properties were shown in Table 11.

Example 2 (Manufacturing of Organic Thin Film Transistor Element of the Present Invention)

Au was vacuum evaporated on an n-doped silicon wafer with a Si thermal oxide film using a shadow mask to form a source electrode and a drain electrode each having a channel length of 20 μm and a channel width of 100 μm. Next, the substrate was treated with 10 mM pentafluorobenzenethiol (Tokyo Chemical Industry Co., Ltd.), and the organic semiconductor composition 1 obtained in Example 1 was applied on the substrate by a spin coating method, and then the organic solvent was dried under the conditions of 140° C. and 10 minutes using a hot plate to form an organic thin film (organic semiconductor layer), thereby producing the bottom contact type organic thin film transistor element 1 of the present invention (FIG. 1A). In the organic thin film transistor element 1, the thermal oxide film in the n-doped silicon wafer with thermal oxide film had a function of an insulation layer, and the n-doped silicon wafer had the functions of a substrate and a gate electrode.

(Property Evaluation of Organic Thin Film Transistor Element 1)

The performance of the organic transistor element depends on the current amount when a potential was applied between the source electrode and the drain electrode while the potential was applied to the gate electrode. Mobility can be calculated by using the measurement results of the current values in the following formula (a) expressing the electrical properties of the carrier species generated in the organic thin film.

$$Id = Z\mu Ci(VG - Vth - VD/2)VD/L \quad (a)$$

In the formula (a), Id is a source/drain current value, Z is a channel width, Ci is an electric capacity of an insulator, VG is a gate potential, Vth is a threshold potential, L is a channel length, and μ is a mobility to be determined (cm$^2$/Vs).

Twelve organic thin film transistor elements 1 were formed on a substrate according to Example 2, and changes in the drain current were measured when the gate voltage was swept from +30 V to −40 V under the conditions of the drain voltage of −1 V. The hole mobility calculated from the equation (a) was 1.42 cm$^2$/Vs, the standard deviation of mobility was 0.18 cm$^2$/Vs, the threshold potential was −0.37 V, and the standard deviation of the threshold potential was 0.21 V.

According to the above results, the organic thin film transistor element 1 obtained by using the organic semiconductor composition of the present invention was an organic thin film transistor element which had small variances in mobility and threshold value while maintaining high mobility.

Example 3 (Preparation of Organic Semiconductor 2 of the Present Invention)

An organic semiconductor composition 2 was prepared according to Example 1 except that OSC-1 was changed to OSC-2, the concentration of OSC-2 was changed to 0.5%, and the concentration of PMMA to 0.026%. Table 11 shows the following items regarding organic semiconductor composition 2; the concentration of OSC-2, the concentration of PMMA, the type and the boiling point of the organic solvent A, the type and the boiling point of organic solvent B, the difference of the boiling points of between the organic solvent A and the organic solvent B, and the content mass ratio of the organic solvent A and the organic solvent B (a:b), the difference ($\Delta P_A$) of a hydrogen bonding term in a solubility parameters of between the organic solvent A and PMMA, and the difference ($\Delta P_B$) of a hydrogen bonding term in solubility parameters of between the organic solvent B and PMMA.

Example 4 (Preparation of Organic Semiconductor Composition 3 of the Present Invention)

The organic semiconductor composition 3 was prepared according to Example 1 except that the concentration of OSC-1 was changed to OSC-3, the concentration of OSC-3 was changed to 1.0%, the concentration of PMMA was changed to 0.053%, and the ratio of the organic solvent A and the organic solvent B was changed from 1:1 to 8:1. Table 11 shows the following items regarding organic semiconductor composition 3; the concentration of OSC-3, the concentration of PMMA, the type and the boiling point of the organic solvent A, the type and the boiling point of organic semiconductor B, the difference of the boiling point of between the organic solvent A and the organic solvent B, and the content mass ratio of the organic solvent A and the organic solvent B (a:b), the difference ($\Delta P_A$) of a hydrogen bonding term in solubility parameters of between the organic solvent A and PMMA, and the difference ($\Delta P_B$) of a hydrogen bonding term in solubility parameters of between the organic solvent B and PMMA.

Examples 5 and 6 (Manufacturing of Organic Thin Film Transistor Elements 2 to 3 of the Present Invention and Property Evaluation)

The organic thin film transistor elements 2 and 3 of the present invention were respectively manufactured according to Example 2 except that the organic semiconductor composition 1 was changed to the organic semiconductor compositions 2 and 3 obtained in Examples 3 and 4 respectively, and the semiconductor properties were evaluated under the same conditions as the property evaluation of the organic thin film transistor element 1. Table 12 shows the property evaluation results of the organic thin film transistor elements 1 to 3.

TABLE 12

Property Evaluation Results of Organic Thin Film Transistor Elements 1 to 3

| | Organic Thin Film Transistor Elements | Mobility ($cm^2$/Vs) Standard Deviation | Threshold Potential (V) Standard Deviation |
|---|---|---|---|
| Example 2 | 1 | 1.420 | −0.370 |
| | | 0.180 | 0.21 |
| Example 5 | 2 | 0.211 | 0.295 |
| | | 0.033 | 0.301 |
| Example 6 | 3 | 0.766 | 0.338 |
| | | 0.167 | 0.341 |

Examples 7 to 9 (Preparation of Organic Semiconductor Compositions 4 to 6 of the Present Invention)

Organic semiconductor compositions 4 to 6 were prepared according to Example 1 except that the organic solvent A was changed from anisole used in Example 1 to each solvent described in Table 13. Table 13 shows the following items regarding organic semiconductor compositions 4 to 6, the concentration of OSC-1, the concentration of PMMA, the type and the boiling point of the organic solvent A, the type and the boiling point of the organic solvent B, the difference of the boiling point of between the organic solvent A and the organic solvent B, the difference ($\Delta P_A$) of a hydrogen bonding term in solubility parameters of between the organic solvent A and PMMA, and the difference ($\Delta P_B$) of a hydrogen bonding term of solubility parameters of between the organic solvent B and PMMA.

Example 10 (Preparation of Organic Semiconductor Composition 7 of the Present Invention)

The organic semiconductor composition 7 was prepared according to Example 1 except that the organic solvent B was changed from tetralin to cyclohexylbenzene and the content mass ratio of the organic solvent A to the organic solvent B was changed from 1:1 to 7:1. Table 13 shows the following items regarding organic semiconductor 7, the concentration of OSC-1, the concentration of PMMA, the type and the boiling point of the organic solvent A, the type and the boiling point of the organic solvent B, the difference of the boiling point of between the organic solvent A and the organic solvent B, the difference ($\Delta P_A$) of a hydrogen bonding term in solubility parameters between the organic solvent A and PMMA, and the difference ($\Delta P_B$) of a hydrogen bonding term in solubility parameters of between the organic solvent B and PMMA.

TABLE 11

Organic Semiconductor Compounds 1 to 3

| Examples | Organic Semiconductor Compounds | Organic Semiconductor Concentration(%) | Concentration (%) | Organic Solvent A (Boiling Point) | Organic Solvent B (Boiling Point) | Boiling Point Difference (B − A) | a:b | $\Delta P_A$ | $\Delta P_B$ |
|---|---|---|---|---|---|---|---|---|---|
| 1 | 1 | 0.3 | 0.016 | anisole (154° C.) | tetralin (207° C.) | 53° C. | 1:1 | 1.8 | 2.2 |
| 3 | 2 | 0.5 | 0.026 | anisole (154° C.) | tetralin (207° C.) | 53° C. | 1:1 | 1.8 | 2.2 |
| 4 | 3 | 1 | 0.053 | anisole (154° C.) | tetralin (207° C.) | 53° C. | 8:1 | 1.8 | 2.2 |

TABLE 13

Organic Semiconductor Compounds 1, 4 to 7

| Examples | Organic Semiconductor Compounds | OSC-1 Concentration (%) | PMMA Concentration (%) | Organic Solvent A (Boiling Point) | Organic Solvent B (Boiling Point) | Boiling Point Difference (B − A) | $\Delta P_A$ | $\Delta P_B$ |
|---|---|---|---|---|---|---|---|---|
| 1 | 1 | 0.3 | 0.016 | anisole (154° C.) | tetralin (207° C.) | 53° C. | 1.8 | 2.2 |
| 7 | 4 | 0.3 | 0.016 | 4-methylanisole (175° C.) | tetralin (207 ° C.) | 32° C. | 1.8 | 2.2 |
| 8 | 5 | 0.3 | 0.016 | phenetole (173° C.) | tetralin (207° C.) | 34° C. | 1.8 | 2.2 |
| 9 | 6 | 0.3 | 0.016 | phenyl acetate (195° C.) | tetralin (207° C.) | 12° C. | 1.3 | 2.2 |
| 10 | 7 | 0.3 | 0.016 | anisole (154° C.) | Cyclohexylbenzene (236° C.) | 82° C. | 1.8 | 4.1 |

Examples 11 to 14 (Manufacturing and Property Evaluation of Organic Thin Film Transistor Elements 4 to 7 of the Present Invention)

The organic thin film transistor elements 4 to 7 of the present invention were manufactured according to Example 2 except that the organic semiconductor composition 1 was changed to the organic semiconductor compositions 4 to 7 obtained in Examples 7 to 10, respectively, and the semiconductor properties were evaluated under the same conditions as the evaluation of the organic thin film transistor element 1. Table 14 shows the property evaluation results of the organic thin film transistor elements 4 to 7.

TABLE 14

Property Evaluation Results of Organic Thin Film Transistor Elements 1, 4 to 7

| Examples | Organic Thin Film Transistor Elements | Mobility (cm²/Vs) Standard Deviation | Threshold Potential (V) Standard Deviation |
|---|---|---|---|
| 2 | 1 | 1.420 0.180 | −0.370 0.201 |
| 11 | 4 | 0.770 0.120 | −0.017 0.150 |
| 12 | 5 | 0.460 0.059 | 0.450 0.100 |
| 13 | 6 | 1.990 0.390 | −0.041 0.230 |
| 14 | 7 | 0.890 0.231 | 0.874 1.729 |

According to the above results, the organic thin film transistor elements 2 to 7 obtained by using the organic semiconductor composition of the present invention were an organic thin film transistor element which had small variance in mobility and threshold value while maintaining high mobility.

Comparative Example 1 (Preparation of Organic Semiconductor Composition 8 for Comparison)

Organic semiconductor composition 8 for comparison was prepared according to Example 1 except that the mixed solution of anisole and tetralin was changed to only anisole. Table 15 shows the following items regarding organic semiconductor composition 8, the concentration of OSC-1, the concentration of PMMA, the type and the boiling point of the organic solvent A, the difference ($\Delta P_A$) of a hydrogen bonding term in solubility parameters of between the organic solvent A and PMMA.

TABLE 15

Organic Semiconductor Compound 8

| Comparative Examples | Organic Semiconductor Compounds | OSC-1 Concentration (%) | PMMA Concentration (%) | Organic Solvent A (Boiling Point) | Organic Solvent B (Boiling Point) | Boiling Point Difference (B − A) | $\Delta P_A$ | $\Delta P_B$ |
|---|---|---|---|---|---|---|---|---|
| 1 | 8 | 0.3 | 0.016 | anisole (154° C.) | — | — | 1.8 | — |

Comparative Example 2 (Manufacturing and Property Evaluation of Organic Thin Film Transistor Element 8 for Comparison)

The organic thin film transistor element 8 for comparison were manufactured according to Example 2 except that the organic semiconductor composition 1 was changed to the organic semiconductor composition 8 obtained in Comparative Example 1, and the semiconductor properties were evaluated under the same conditions as the evaluation of the organic thin film transistor element 1. Table 16 shows the property evaluation results of the organic thin film transistor element 8.

TABLE 16

Property Evaluation Result of Organic Thin Film Transistor Element 8

| Comparative Example | Organic Thin Film Transistor Element | Mobility (cm²/Vs) Standard Deviation | Threshold Potential (V) Standard Deviation |
|---|---|---|---|
| 2 | 8 | 0.370 0.095 | −5.100 4.700 |

According to the above results, the organic thin film transistor element 8 obtained by using the organic semiconductor composition for comparison had larger variance in threshold value than the organic thin film transistor element of the present invention.

Comparative Example 3 (Preparation of Organic Semiconductor Composition 9 for Comparison)

Organic semiconductor composition 9 was prepared by adding OSC-1 and PMMA for concentrations to be 0.3% and 0.003%, respectively with respect to a mixed solution in which anisole (Tokyo Chemical Industry Co., Ltd.) and tetralin (Tokyo Chemical Industry Co., Ltd.) were mixed at a ratio of 9:1. Table 17 shows the following items regarding organic semiconductor composition 9, the concentration of OSC-1, the concentration of PMMA, the type and the boiling point of the organic solvent A, the type and the boiling point of the organic solvent B, and the content mass ratio of the organic solvent A to the organic solvent B (a:b).

Comparative Example 4 (Manufacturing and Property Evaluation of Organic Thin Film Transistor Element 9 for Comparison)

The organic thin film transistor element 9 for comparison were manufactured according to Example 2 except that the organic semiconductor composition 1 was changed to the organic semiconductor composition 9 obtained in comparative Example 3, and the semiconductor properties were evaluated under the same conditions as the property evaluation of the organic thin film transistor element 1. Table 18 shows the evaluation results of the organic thin film transistor element 9.

Example 15 (Preparation of Organic Semiconductor Composition 10 of the Present Invention)

Organic semiconductor composition 10 was prepared according to Example 1 except that the ratio of anisole and tetralin was changed to 8:1. Table 17 shows the following items regarding organic semiconductor composition 10, the concentration of OSC-1, the concentration of PMMA, the type and the boiling point of the organic solvent A, the type and the boiling point of the organic solvent B, and content mass ratio of the organic solvent A to the organic solvent B (a:b).

Example 16 (Manufacturing and Property Evaluation of Organic Thin Film Transistor Elements 10 of the Present Invention)

The organic thin film transistor element 10 of the present invention was manufactured according to Example 2 except that the organic semiconductor composition 1 was changed to the organic semiconductor composition 10 obtained in Example 15, and the semiconductor properties were evaluated under the same conditions as the property evaluation of the organic thin film transistor element 1. Table 18 shows the property evaluation results of the organic thin film transistor element 10.

Example 17 (Preparation of Organic Semiconductor Composition 11 of the Present Invention)

Organic semiconductor composition 11 was prepared according to Example 1 except that the ratio of anisole and tetralin was changed to 1:5 and the concentration of PMMA was changed to 0.003%. Table 17 shows the following items regarding organic semiconductor composition 11, the concentration of OSC-1, the concentration of PMMA, the type and the boiling point of the organic solvent A, the type and the boiling point of the organic solvent B, and the content mass ratio of the organic solvent A to the organic solvent B (a:b).

Example 18 (Manufacturing and Property Evaluation of Organic Thin Film Transistor Element 11 of the Present Invention)

The organic thin film transistor element 11 of the present invention was manufactured according to Example 2 except that the organic semiconductor composition 1 was changed to the organic semiconductor composition 11 obtained in Example 17, and the semiconductor properties were evaluated under the same conditions as the evaluation of the organic thin film transistor element 1. Table 18 shows the evaluation results of the organic thin film transistor element 11.

Example 19 (Preparation of Organic Semiconductor Composition 12 of the Present Invention)

Organic semiconductor composition 12 was prepared according to Example 1 except that the ratio of anisole and tetralin was changed to 1:8. Table 17 shows the following items regarding organic semiconductor composition 12, the concentration of OSC-1, the concentration of PMMA, the type and the boiling point of the organic solvent A, the type and the boiling point of the organic solvent B, and the content mass ratio of the organic solvent A to the organic solvent B (a:b).

Example 20 (Manufacturing and Property Evaluation of Organic Thin Film Transistor Element 12 of the Present Invention)

The organic thin film transistor element 12 of the present invention was manufactured according to Example 2 except that the organic semiconductor composition 1 was changed to the organic semiconductor composition 12 obtained in Example 19, and the semiconductor properties were evaluated under the same conditions as the evaluation of the organic thin film transistor element 1. Table 18 shows the evaluation results of the organic thin film transistor element 12.

Comparative Example 5 (Preparation of Organic Semiconductor Composition 13 for Comparison)

Organic semiconductor composition 13 for comparison was prepared according to Comparative Example 3 except that the ratio of anisole and tetralin was changed to 1:9. Table 17 shows the following items regarding organic semiconductor composition 13, the concentration of OSC-1, the concentration of PMMA, the type and the boiling point of the organic solvent A, the type and the boiling point of the organic solvent B, and the content mass ratio of the organic solvent A to the organic solvent B (a:b).

Comparative Example 6 (Manufacturing and Property Evaluation of Organic Thin Film Transistor Element 13 for Comparison)

The organic thin film transistor element 13 for comparison was manufactured according to Example 2 except that the organic semiconductor composition 1 was changed to the organic semiconductor composition 13 obtained in Comparative Example 5, and the semiconductor properties were evaluated under the same conditions as the property evaluation of the organic thin film transistor element 1. Table 18 shows the property evaluation results of the organic thin film transistor element 13.

Example 22 (Manufacturing and Property Evaluation of Organic Thin Film Transistor 14 of the Present Invention)

The organic thin film transistor element 14 of the present invention was manufactured according to Example 2 except that the organic semiconductor composition 1 was changed to the organic semiconductor composition 14 obtained in Example 21, and the semiconductor properties were evaluated under the same conditions as the property evaluation of the organic thin film transistor element 1. Table 20 shows the evaluation results of the organic thin film transistor element 14.

TABLE 17

Organic Semiconductor Compounds 1, 9 to 13

| | Organic Semiconductor Compounds | OSC-1 Concentration (%) | PMMA Concentration (%) | Organic Solvent A (Boiling Point) | Organic Solvent B (Boiling Point) | a:b |
|---|---|---|---|---|---|---|
| Example 1 | 1 | 0.3 | 0.016 | anisole (154° C.) | tetralin (207° C.) | 1:1 |
| Example 15 | 10 | 0.3 | 0.016 | anisole (154° C.) | tetralin (207° C.) | 8:1 |
| Example 17 | 11 | 0.3 | 0.003 | anisole (154° C.) | tetralin (207° C.) | 1:5 |
| Example 19 | 12 | 0.3 | 0.016 | anisole (154° C.) | tetralin (207° C.) | 1:8 |
| Comparative Example 3 | 9 | 0.3 | 0.003 | anisole (154° C.) | tetralin (207° C.) | 9:1 |
| Comparative Example 5 | 13 | 0.3 | 0.003 | anisole (154° C.) | tetralin (207° C.) | 1:9 |

TABLE 18

Property Evaluation Results of Organic Thin Film Transistor Elements 1, 9 to 13

| | Organic Thin Film Transistor Elements | Mobility (cm$^2$/Vs) Standard Deviation | Threshold Potential (V) Standard Deviation |
|---|---|---|---|
| Example 2 | 1 | 1.420 0.180 | −0.370 0.201 |
| Example 16 | 10 | 1.847 0.290 | −0.637 0.312 |
| Example 18 | 11 | 1.260 0.200 | −0.330 0.400 |
| Example 20 | 12 | 0.998 0.160 | 0.538 0.133 |
| Comparative Example 4 | 9 | 1.590 0.280 | −2.900 2.900 |
| Comparative Example 6 | 13 | 2.380 0.420 | −5.800 2.600 |

According to the above results, the organic thin film transistor element obtained by using the organic semiconductor composition of the present invention were an organic thin film transistor element which had small variance in mobility and threshold value while maintaining high mobility, on the other hand, the organic thin film transistor element obtained by using the organic semiconductor composition for comparison had large variance in threshold value.

Example 21 (Preparation of Organic Semiconductor Composition 14 of the Present Invention)

Organic semiconductor composition 14 was prepared according to Example 1 except that the concentration of PMMA to be dissolved in the mixed solution was changed to 0.003%. Table 19 shows the following items regarding organic semiconductor composition 14, the concentration of OSC-1, the concentration of PMMA, the type and the boiling point of the organic solvent A, the type and the boiling point of the organic solvent B, and the content mass ratio of the organic solvent A to the organic solvent B (a:b).

Example 23 (Preparation of Organic Semiconductor Composition 15 of the Present Invention)

Organic semiconductor composition 15 was prepared according to Example 1 except that the concentration of PMMA which dissolved in mixed solution was changed to 0.05%. Table 19 shows the following items regarding organic semiconductor composition 15, the concentration of OSC-1, the concentration of PMMA, the type and the boiling point of the organic solvent A, the type and the boiling point of the organic solvent B, and the content mass ratio of the organic solvent A to the organic solvent B (a:b).

Example 24 (Manufacturing and Property Evaluation of Organic Thin Film Transistor Element 15 of the Present Invention)

The organic thin film transistor element 15 of the present invention was manufactured according to Example 2 except that the organic semiconductor composition 1 was changed to the organic semiconductor composition 15 obtained in Example 23, and the semiconductor properties were evaluated under the same conditions as the property evaluation of the organic thin film transistor element 1. Table 20 shows the evaluation results of the organic thin film transistor element 15.

Example 25 (Preparation of Organic Semiconductor Composition 16 of the Present Invention)

Organic semiconductor composition 16 was prepared according to Example 1 except that the concentration of PMMA which dissolved in mixed solution was changed to 0.2%. Table 19 shows the following items regarding organic semiconductor composition 16, the concentration of OSC-1, the concentration of PMMA, the type and the boiling point of the organic solvent A, the type and the boiling point of the organic solvent B, and the content mass ratio of the organic solvent A to the organic solvent B (a:b).

Example 26 (Manufacturing and Property Evaluation of Organic Thin Film Transistor Element 16 of the Present Invention)

The organic thin film transistor element 16 was manufactured according to Example 2 except that the organic semiconductor composition 1 was changed to the organic semiconductor composition 16 obtained in Example 25, and the semiconductor properties were evaluated under the same conditions as the property evaluation of the organic thin film transistor element 1. Table 20 shows the property evaluation results of the organic thin film transistor element 16.

TABLE 19

Organic Semiconductor Compounds 1, 14 to 16

|  | Organic Semiconductor Compounds | OSC-1 Concentration (%) | PMMA Concentration (%) | Organic Solvent A (Boiling Point) | Organic Solvent B (Boiling Point) | a:b |
|---|---|---|---|---|---|---|
| Example 1 | 1 | 0.3 | 0.016 | anisole (154° C.) | tetralin (207° C.) | 1:1 |
| Example 21 | 14 | 0.3 | 0.003 | anisole (154° C.) | tetralin (207° C.) | 1:1 |
| Example 23 | 15 | 0.3 | 0.05 | anisole (154° C.) | tetralin (207° C.) | 1:1 |
| Example 25 | 16 | 0.3 | 0.2 | anisole (154° C.) | tetralin (207° C.) | 1:1 |

TABLE 20

Property Evaluation Results of Organic Thin Film Transistor Elements 1, 14 to 16

|  | Organic Thin Film Transistor Elements | Mobility ($cm^2/Vs$) Standard Deviation | Threshold Potential (V) Standard Deviation |
|---|---|---|---|
| Example 2 | 1 | 1.420 0.180 | −0.370 0.201 |
| Example 22 | 14 | 2.080 0.260 | −0.500 0.170 |
| Example 24 | 15 | 0.670 0.140 | −0.300 0.130 |
| Example 26 | 16 | 0.570 0.180 | −0.430 0.320 |

According to the above results, the organic thin film transistor element obtained by using the organic semiconductor composition of the present invention was an organic thin film transistor element which had small variance in mobility and threshold value and excellent uniformity of properties.

Example 27 (Preparation of Organic Semiconductor Composition 17 of the Present Invention)

Organic semiconductor composition 17 was prepared by adding OSC-1 and PS (Aldrich Corp., molecular weight 1,000,000) for concentrations to be 0.3% and 0.15%, respectively with respect to a mixed solution in which o-xylene (KANTO CHEMICAL CO., INC.) and 1-phenoxy-2-propanol (Tokyo Chemical Industry Co., Ltd.) were mixed at a ratio of a:b=8:1. The difference of a hydrogen bonding term in the solubility parameters of between o-xylene and PS was 0.20 cal/cm³, and the difference of the solubility parameters of between 1-phenoxy-2-propanol and PS was 11.0 cal/cm³. Table 21 shows the concentration of OSC-1, the concentration of PS, the type and the boiling point of the organic solvent A, the type and the boiling point of the organic solvent B, the difference of the boiling point of between the organic solvent A and the organic solvent B, the content mass ratio of the organic solvent A and the organic solvent B (a:b), the difference ($\Delta P_A$) of a hydrogen bonding term in the solubility parameters of between the organic solvent A and PS, and the difference ($\Delta P_B$) of a hydrogen bonding term in solubility parameters of between the organic solvent B and PS.

Example 28 (Manufacturing and Property Evaluation of Organic Thin Film Transistor Element 17 of the Present Invention)

The organic thin film transistor element 17 of the present invention was manufactured according to Example 2 except that the organic semiconductor composition 1 was changed to the organic semiconductor composition 17 obtained in Example 27, and the semiconductor properties were evaluated under the same conditions as the property evaluation of the organic thin film transistor element 1. Table 22 shows the property evaluation results of the organic thin film transistor element 17.

TABLE 21

| | Organic Semiconductor Compounds | OSC-1 Concentration (%) | Insulating Compound | Insulation Compound Concentration (%) | Organic Solvent A (Boiling Point) | Organic Solvent B (Boiling Point) | Soiling Point Difference (S − A) | a:b | $\Delta P_A$ | $\Delta P_B$ |
|---|---|---|---|---|---|---|---|---|---|---|
| Example 27 | 17 | 0.3 | PS | 0.15 | o-xylene (145° C.) | 1-phenoxy-2-propanol (243° C.) | 98° C | 8:1 | 0.2 | 11.0 |

TABLE 22

Property Evaluation Result of Organic Thin Film Transistor Element 17

| Organic Thin Film Transistor Element | Mobility (cm²/Vs) Standard Deviation | Threshold Potential (V) Standard Deviation |
|---|---|---|
| Example 28 | 17 | 1.481 0.344 | 0.491 0.127 |

According to the above results, the organic thin film transistor element obtained by using the organic semiconductor composition of the present invention was an organic thin film transistor element which had small variance in mobility and threshold value and excellent uniformity of properties.

Example 29 (Preparation of Organic Semiconductor Composition 18 of the Present Invention)

Organic semiconductor composition 18 was prepared according to Example 1 except that the molecular weight of PMMA to be dissolved in the mixed solution was changed to 15,000. Table 23 shows the concentration of OSC-1, the molecular weight of PMMA, the concentration of PMMA, the type and the boiling point of the organic solvent A, the type and the boiling point of the organic solvent B, and the content mass ratio of the organic solvent A to the organic solvent B (a:b).

Example 30 (Manufacturing and Property Evaluation of Organic Thin Film Transistor Element 18 of the Present Invention)

The organic thin film transistor element 18 of the present invention was manufactured according to Example 2 except that the organic semiconductor composition 1 was changed to the organic semiconductor composition 18 obtained in Example 29, and the semiconductor properties were evaluated under the same conditions as the property evaluation of the organic thin film transistor element 1. Table 24 shows the property evaluation results of the organic thin film transistor element 18.

Example 31 (Preparation of Organic Semiconductor Composition 19 of the Present Invention)

Organic semiconductor composition 19 was prepared according to Example 1 except that the molecular weight of PMMA to be dissolved in the mixed solution was changed to 350,000. Table 23 shows the concentration of OSC-1, the molecular weight of PMMA, the concentration of PMMA, the type and the boiling point of the organic solvent A, the type and the boiling point of the organic solvent B, and the content mass ratio of the organic solvent A to the organic solvent B (a:b).

Example 32 (Manufacturing and Property Evaluation of Organic Thin Film Transistor Element 19 of the Present Invention)

The organic thin film transistor element 19 of the present invention was manufactured according to Example 2 except that the organic semiconductor composition 1 was changed to the organic semiconductor composition 19 obtained in Example 31, and the semiconductor properties were evaluated under the same conditions as the property evaluation of the organic thin film transistor element 1. Table 24 shows the property evaluation results of the organic thin film transistor element 19.

TABLE 23

Organic Semiconductor Compounds 18 and 19

| | Organic Semiconductor Compounds | OSC-1 Concentration (%) | PMMA Molecular Weight | PMMA Concentration (%) | Organic Solvent A (Boiling Point) | Organic Solvent B (Boiling Point) | a:b |
|---|---|---|---|---|---|---|---|
| Example 29 | 18 | 0.3 | 15,000 | 0.016 | anisole (154° C.) | tetralin (207° C.) | 1:1 |
| Example 31 | 19 | 0.3 | 350,000 | 0.016 | anisole (154° C.) | tetralin (207° C.) | 1:1 |

TABLE 24

Property Evaluation Results of Organic Thin Film Transistor Elements 18 and 19

| Organic Thin Film Transistor Elements | Mobility (cm²/Vs) Standard Deviation | Threshold Potential (V) Standard Deviation |
|---|---|---|
| Example 30 | 18 | 1.993 0.319 | −0.459 0.299 |
| Example 32 | 19 | 1.461 0.201 | −0.086 0.052 |

According to the above results, the organic thin film transistor element obtained by using the organic semiconductor composition of the present invention was an organic thin film transistor element which had small variance in mobility and threshold value and excellent uniformity of properties.

Comparative Example 7 (Preparation of Organic Semiconductor Composition 20 for Comparison)

Organic semiconductor composition 20 for comparison was prepared according to Example 1 except that no PMMA was added, and that the organic solvents which to be used were changed to the composition described in Patent Literature 1, specifically, the organic solvents A and B which were good solvents for the organic semiconductor and solvent C which was poor solvent for the organic semiconductor were used, which were shown as Comparative Example 7 in Table 25. Comparative Example 7 in Table 25 shows the following items regarding organic semiconductor composition 20 which were used in Comparative Example 7, the concentration of OSC-1, the type and the boiling point of the organic solvent A, the type and the boiling point of the organic solvent B, the type and the boiling point of the organic solvent C, and the content mass ratio of the organic solvent A, the organic solvent B to the organic solvent C (a:b:c).

Comparative Example 8 (Trial of Manufacturing of Organic Thin Film Transistor Element for Comparison)

Manufacturing of an organic thin film transistor element for comparison according to Example 2 was attempted except that the organic semiconductor composition 1 was changed to the organic semiconductor composition 20 obtained in Comparative Example 7, but the film could not be formed on the substrate by spin coating method. Therefore, evaluation of semiconductor properties was not performed (see Table 26).

Comparative Example 9 (Preparation of Organic Semiconductor Composition 21 for Comparison)

In the same manner as Comparative Example 7, organic semiconductor composition 21 for comparison was prepared according to Example 1 except that no PMMA was added and that the organic solvents which to be used were changed to the composition described in Patent Literature 1. Comparative Example 9 in Table 25 shows the following items regarding organic semiconductor composition 21 which were used in Comparative Example 9, the concentration of OSC-1, the type and the boiling point of the organic solvent A, the type and the boiling point of the organic solvent B, the type and the boiling point of the organic solvent C, and the content mass ratio of the organic solvent A, the organic solvent B to the organic solvent C (a:b:c).

Comparative Example 10 (Manufacturing of Organic Thin Film Transistor Element 20 for Comparison)

The organic thin film transistor element 20 for comparison was manufactured according to Example 2 except that the organic semiconductor composition 1 was changed to the organic semiconductor composition 21 obtained in Comparative Example 9, and the semiconductor properties were evaluated under the same conditions as the property evaluation of the organic thin film transistor element 1. Table 26 shows the property evaluation results of the organic thin film transistor element 20.

TABLE 25

Organic Semiconductor Compounds 20 to 21

| | Organic Semiconductor Compounds | OSC-1 Concentration (%) | PMMA Concentration (%) | Organic Solvent A (Boiling Point) | Organic Solvent B (Boiling Point) | | a:b:c |
|---|---|---|---|---|---|---|---|
| Comparative Example 7 | 20 | 0.5 | anisole (154° C.) | veratrole (207° C.) | 3,7-dimethyl-1-octanol (213° C.) | | 4:1:5 |
| Comparative Example 9 | 21 | 0.5 | anisole (154° C.) | propyl benzoate (230° C.) | bicyclohexyl (239° C.) | | 38:26:36 |

TABLE 26

Property Evaluation Results of Organic Thin Film Transistor Element 20

| | Organic Thin Film Transistor Elements | Mobility (cm²/Vs) Standard Deviation | Threshold Potential (V) Standard Deviation |
|---|---|---|---|
| Comparative Example 8 | No film formation | — | — |
| Comparative Example 10 | 20 | 1.510 0.554 | 8.618 1.680 |

Comparative Example 11 (Preparation of Organic Semiconductor Composition 22 for Comparison)

Organic semiconductor composition 22 for comparison was prepared according to Example 1 except that no PMMA was added, and that the organic solvents were changed to the composition described in Patent Literature 3, specifically, the solvents A which was good solvent for the organic semiconductor and solvent B which was poor solvent for the organic semiconductor were used shown as Comparative Example 11 in Table 27. Table 27 shows the following items regarding organic semiconductor composition 22, the concentration of OSC-1, the type and the boiling point of the organic solvent A, the type and the boiling point of the organic solvent B, and the content mass ratio of the organic solvent A to the organic solvent B (a:b).

Comparative Example 12 (Manufacturing of Organic Thin Film Transistor Element 21 for Comparison)

The organic thin film transistor element 21 for comparison was manufactured according to Example 2 except that the organic semiconductor composition 1 was changed to the organic semiconductor composition 22 obtained in Comparative Example 11, and the semiconductor properties were evaluated under the same conditions as the property evaluation of the organic thin film transistor element 1. Table 28 shows the evaluation results of the organic thin film transistor element 21.

Comparative Example 13 (Preparation of Organic Semiconductor Composition 23 for Comparison)

Similar to Comparative Example 11, organic semiconductor composition 23 for comparison was prepared according to Example 1 except that no PMMA was added, and the organic solvents were changed to the composition described in Patent Literature 3. Comparative Example 13 in Table 27 shows the following items regarding organic semiconductor composition 23 which were used in Comparative Example 13, the concentration of OSC-1, the type and the boiling point of the organic solvent A, the type and the boiling point of the organic solvent B, and the content mass ratio of the organic solvent A to the organic solvent B (a:b).

Comparative Example 14 (Manufacturing of Organic Thin Film Transistor Element 22 for Comparison)

The organic thin film transistor element 22 for comparison was manufactured according to Example 2 except that the organic semiconductor composition 1 was changed to the organic semiconductor composition 23 obtained in Comparative Example 13, and the semiconductor properties were evaluated under the same conditions as the property evaluation of the organic thin film transistor element 1. Table 28 shows the evaluation results of the organic thin film transistor element 22.

TABLE 27

Organic Semiconductor Compounds 22 to 23

| | Organic Semiconductor Compounds | OSC-1 Concentration (%) | Organic Solvent A (Boling Point) | Organic Solvent B (Soling Point) | a:b |
|---|---|---|---|---|---|
| Comparative Example 11 | 22 | 0.5 | anisole (154° C.) | 1-butanol (118° C.) | 98:2 |
| Comparative Example 13 | 23 | 0.5 | toluene (111° C.) | methanol (65° C.) | 99.4:0.6 |

TABLE 28

Property Evaluation Result of Organic Thin Film Transistor Elements 21 to 22

| | Organic Thin Film Transistor Elements | Mobility (cm²/Vs) Standard Deviation | Threshold Potential (V) Standard Deviation |
|---|---|---|---|
| Comparative Example 12 | 21 | 0.781 0.502 | −1.148 2.779 |
| Comparative Example 14 | 22 | 0.837 0.280 | 4.059 1.640 |

According to the above results, the organic thin film transistor elements 20 to 22 obtained by using the organic semiconductor composition for comparison were the organic thin film transistor elements had larger variance in mobility and threshold value than the organic thin film transistor element obtained by using the organic semiconductor composition of the present invention. It was found from the results that the organic thin film transistor which had small variance in mobility while maintaining high mobility, and furthermore had small variance in threshold value could not be manufactured only with the solvent compositions described in Patent Literatures 1 and 3. Therefore, it can be said that the effects of the present invention cannot be easily estimated from Patent Literatures 1 and 3.

REFERENCE NUMBER LIST

1 Source electrode
2 Organic thin film (organic semiconductor layer)
3 Drain electrode
4 Insulation layer
5 Gate electrode
6 Substrate
7 Protective layer

The invention claimed is:
1. An organic thin film formed by a spin coating method using an organic semiconductor composition comprising
an organic semiconductor compound,
an insulation compound,
an organic solvent A which is capable of dissolving 0.1 parts or more of the insulation compound in 100 parts of the solvent A, and
an organic solvent B which is capable of dissolving less than 0.1 parts of the insulation compound in 100 parts of the solvent B and has a higher boiling point than the organic solvent A,
wherein the content mass ratio a:b of the organic solvent A and the organic solvent B is 1:8 to 8:1,
wherein the organic semiconductor compound and the insulation compound are dissolved into a mixture containing the organic solvent A and the organic solvent B,
wherein the insulation compound is a compound having a following repeating unit of formula (1) or (2):

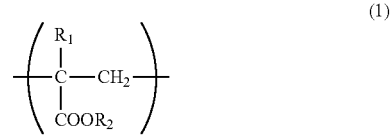

(1)

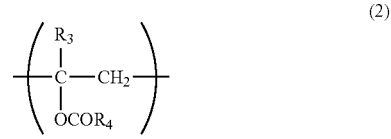

(2)

wherein, in the formula (1) and (2), $R_1$ to $R_4$ are each independently a linear or branched alkyl group having 1 to 20 carbon atoms, and
wherein the organic solvent A is a solvent comprising a compound having an ether group, a ketone group, or an ester group, and the organic solvent B is a solvent comprising an aromatic hydrocarbon compound.
2. The organic thin film according to claim 1, wherein the organic semiconductor compound is a compound having an acene structure, a phenacene structure, or a heteroacene structure.

3. The organic thin film according to claim 2,
wherein the compound having the heteroacene structure is a compound having a thienothiophene structure.

4. The organic thin film according to claim 1,
wherein both the organic solvent A and the organic solvent B are solvents comprising an aromatic compound.

5. The organic thin film according to claim 1,
wherein a difference of boiling points between the organic solvent A and the organic solvent B is 10° C. or more.

6. The organic thin film according to claim 5,
wherein the difference of the boiling points between the organic solvent A and the organic solvent B is 130° C. or less.

7. The organic thin film according to claim 1,
wherein both solubility of the organic semiconductor compound in the organic solvent A and solubility of the organic semiconductor compound in the organic solvent B are 0.2% by mass or more.

8. The organic thin film according to claim 1,
wherein solubility of the insulation compound in the organic solvent A is 0.5% by mass or more and solubility of the insulation compound in the organic solvent B is 0.05% by mass or less.

9. The organic thin film according to claim 1,
wherein a difference of a hydrogen bonding term in a Hansen solubility parameter between the organic solvent A and the insulation compound is 2.5 cal/cm$^3$ or less, and a difference of a hydrogen bonding term in a Hansen solubility parameter between the organic solvent B and the insulation compound is 2.0 cal/cm$^3$ or more.

10. The organic thin film according to claim 9,
wherein the difference of the hydrogen bonding term in the Hansen solubility parameter between the organic solvent B and the insulation compound is 5.0 cal/cm$^3$ or less.

11. The organic thin film according to claim 1,
wherein the content mass ratio a:b of the organic solvent A and the organic solvent B is 1:5 to 5:1.

12. The organic thin film according to claim 11,
wherein the content mass ratio a:b of the organic solvent A and the organic solvent B is 1:5 to 2:1.

13. The organic thin film according to claim 1,
wherein the content of the insulation compound based on the total amount of the organic semiconductor compound and the insulation compound is 1 to 80% by mass.

14. The organic thin film according to claim 13,
wherein the content of the insulation compound based on the total amount of the organic semiconductor compound and the insulation compound is 1 to 15% by mass.

15. An organic thin film transistor having the organic thin film according to claim 1.

* * * * *